US012103277B2

(12) United States Patent
Nakanishi et al.

(10) Patent No.: US 12,103,277 B2
(45) Date of Patent: Oct. 1, 2024

(54) SHOCK ABSORBING LAMINATE AND DISPLAY DEVICE

(71) Applicant: Panasonic Intellectual Property Management Co., Ltd., Osaka (JP)

(72) Inventors: Tadatoshi Nakanishi, Osaka (JP); Kakeru Hanabusa, Osaka (JP); Motoi Kawamura, Osaka (JP); Muneo Yamada, Mie (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 339 days.

(21) Appl. No.: 17/426,211

(22) PCT Filed: Jan. 27, 2020

(86) PCT No.: PCT/JP2020/002683
§ 371 (c)(1),
(2) Date: Jul. 28, 2021

(87) PCT Pub. No.: WO2020/158639
PCT Pub. Date: Aug. 6, 2020

(65) Prior Publication Data

US 2022/0097353 A1 Mar. 31, 2022

(30) Foreign Application Priority Data

Jan. 29, 2019 (JP) ................................ 2019-013677

(51) Int. Cl.
*B32B 27/12* (2006.01)
*B32B 5/02* (2006.01)
*B32B 27/20* (2006.01)
*B32B 27/38* (2006.01)
(Continued)

(52) U.S. Cl.
CPC .............. *B32B 27/12* (2013.01); *B32B 5/024* (2013.01); *B32B 27/20* (2013.01); *B32B 27/38* (2013.01);
(Continued)

(58) Field of Classification Search
None
See application file for complete search history.

(56) References Cited

U.S. PATENT DOCUMENTS

2004/0174651 A1* 9/2004 Aisenbrey .............. F21V 29/76 361/103
2016/0279900 A1 9/2016 Fujiwara et al.
2017/0151750 A1 6/2017 Takasu

FOREIGN PATENT DOCUMENTS

CN 109207084 1/2019
JP 2007-272151 A 10/2007
(Continued)

OTHER PUBLICATIONS

Machine Translation of JP2011084733 (Year: 2011).*
(Continued)

*Primary Examiner* — Shawn Mckinnon
(74) *Attorney, Agent, or Firm* — GREENBLUM & BERNSTEIN, P.L.C.

(57) ABSTRACT

A shock absorbing laminate includes: a shock absorbing layer having an adhesive property and a stress relieving property; a heat diffusion layer having a thermal diffusive property, and a shield layer having electromagnetic interference shielding characteristics. The shock absorbing layer, the heat diffusion layer, and the shield layer are stacked on one another. The shock absorbing laminate which has heat dissipation characteristics and electromagnetic interference shielding characteristics and which can be affixed to another member without using the adhesive layer can be provided.

14 Claims, 5 Drawing Sheets

(51) Int. Cl.
*H05K 7/20* (2006.01)
*H05K 9/00* (2006.01)

(52) U.S. Cl.
CPC ....... *H05K 7/20963* (2013.01); *H05K 9/0054* (2013.01); *B32B 2307/202* (2013.01); *B32B 2307/212* (2013.01); *B32B 2307/30* (2013.01); *B32B 2307/56* (2013.01); *B32B 2457/20* (2013.01); *H05K 9/009* (2013.01)

(56) References Cited

FOREIGN PATENT DOCUMENTS

| | | | |
|---|---|---|---|
| JP | 2009-079347 | A | 4/2009 |
| JP | 2011084733 | * | 4/2011 |
| JP | 2016-043691 | A | 4/2016 |
| JP | WO2016047272 | * | 4/2017 |
| JP | 2018-087334 | A | 6/2018 |
| JP | 2018109102 | * | 7/2018 |
| WO | WO 2015/072487 | A1 | 5/2015 |
| WO | WO 2016/047272 | A1 | 3/2016 |
| WO | WO 2018/131619 | A1 | 7/2018 |

OTHER PUBLICATIONS

Machine Translation of JPWO2016047272 (Year: 2017).*
Machine Translation of JP2018109102 (Year: 2018).*
China Office Action received in CN Application No. 202080011283.3, dated Feb. 16, 2023.
ISR for PCT/JP2020/002683, dated Apr. 14, 2020 (w/ translation).

* cited by examiner

SHOCK ABSORBING LAMINATE AND DISPLAY DEVICE

TECHNICAL FIELD

The present disclosure generally relates to shock absorbing laminates and display devices, and specifically, to a shock absorbing laminate and a display device which include a shock absorbing layer having an adhesive property and a stress relieving property.

BACKGROUND ART

Patent Literature 1 discloses a shock-absorbing sheet. The shock-absorbing sheet has a storage elastic modulus of greater than or equal to $1.0\times10^5$ Pa and less than or equal to $2.5\times10^7$ Pa at 23° C., a tan δ of greater than or equal to 0.3 at 23° C., and a density of greater than or equal to 600 $kg/m^3$.

Such a shock-absorbing sheet is disposed on a back surface of a display device and is configured to absorb a shock that acts on the display device.

When the shock-absorbing sheet is disposed on the back surface of the display device, however, bonding of the shock-absorbing sheet to the back surface of the display device has to be achieved by providing an adhesive agent layer or a two-sided adhesive tape on a surface of the shock-absorbing sheet. Thus, the display device, on which the bonding of the shock-absorbing sheet has been achieved, has an increased thickness or is inflexible, and thus, features, such as a reduced thickness and bendability, required for the display device may be difficultly exhibited.

CITATION LIST

Patent Literature

Patent Literature 1: WO2018/131619

SUMMARY OF INVENTION

In view of the foregoing, it is an object of the present disclosure to provide: a shock absorbing laminate which has heat dissipation characteristics and electromagnetic interference shielding characteristics and which can be affixed to another member without an adhesive agent; and a display device.

A shock absorbing laminate according to one aspect of the present disclosure includes: a shock absorbing layer having an adhesive property and a stress relieving property; a heat diffusion layer having a thermal diffusive property; and a shield layer having electromagnetic interference shielding characteristics. The shock absorbing layer, the heat diffusion layer, and the shield layer are stacked on one another.

A display device according to one aspect of the present disclosure includes the shock absorbing laminate and a display panel. The display panel has a non-display-side surface with which the shock absorbing layer is in contact.

DESCRIPTION OF EMBODIMENTS

[Schema of Shock Absorbing Laminate]

Figure 1A:
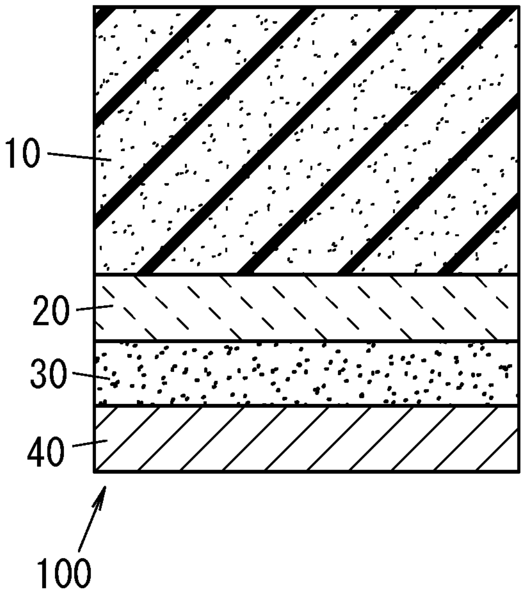
FIG. 1A is a view schematically illustrating a shock absorbing laminate of an embodiment according to the present disclosure.

FIG. 1A shows a shock absorbing laminate 100 according to the present embodiment. The shock absorbing laminate 100 includes: a shock absorbing layer 10 having an adhesive property and a stress relieving property; a heat diffusion layer 20 having a thermal diffusive property, and a shield layer 40 having electromagnetic interference shielding characteristics. The shock absorbing laminate 100 further includes a bonding layer 30. Note that the bonding layer 30 is not an essential element of the shock absorbing laminate 100 and is optionally used. The shock absorbing layer 10, the heat diffusion layer 20, the bonding layer 30, and the shield layer 40 are stacked on one another.

Figure 1B:
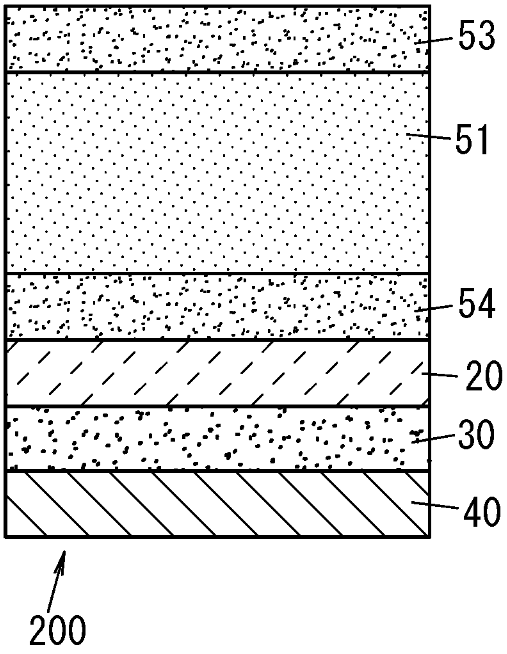
FIG. 1B is a view illustrating a shock absorbing laminate of a comparative example.

FIG. 1B shows a shock absorbing laminate 200 for obtaining substantially the same extent of shock absorbency and an affixing property as the shock absorbing laminate 100. The shock absorbing laminate 200 includes a porous structure layer 51 in order to obtain the shock absorbency. The porous structure layer 51 is formed of foam of polypropylene, polyethylene, polyacrylic, polyurethane, or the like as a material to have a thickness in the range from 50 μm to 1000 μm inclusive. The shock absorbing laminate 200 further includes two adhesive layers 53 and 54 each having a thickness in the range from 3 μm to 50 μm inclusive to obtain the affixing property. The affixing property is a property that enables the shock absorbing laminate 200 to be affixed to another member or another member to be affixed to the porous structure layer 51. The adhesive layer 54 is provided on one surface (a surface facing a heat diffusion layer 20) of the porous structure layer 51. The adhesive layer 53 is provided on the other surface (a surface facing away from the heat diffusion layer 20) of the porous structure layer 51. The heat diffusion layer 20 is bonded to the adhesive layer 54. The heat diffusion layer 20 has one surface provided with a bonding layer 30, and a shield layer 40 is bonded to one surface of the bonding layer 30.

Note that the heat diffusion layer 20 and the shield layer 40 have light shielding properties, and therefore, the shock absorbing laminate 100 and the shock absorbing laminate 200 have light shielding properties.

Thus, the shock absorbing laminate 200 includes the porous structure layer 51 for obtaining the shock absorbency and the two adhesive layers 53 and 54 for obtaining the affixing property and thus has a significantly increased thickness. In contrast, the shock absorbing laminate 100 according to the present embodiment includes the shock absorbing layer 10 having the adhesive property and the stress relieving property, and therefore, the shock absorbing layer 10 provides the shock absorbency and the affixing property. Thus, the shock absorbing laminate 100 includes none of the light shielding base material 52 and the two adhesive layers 53 and 54 but has substantially the same extent of shock absorbency, light shielding property, and affixing property as the shock absorbing laminate 200. Thus, the shock absorbing laminate 100 according to the present embodiment has the shock absorbency, the light shielding property, and the affixing property while having a smaller thickness than the shock absorbing laminate 200 (the thickness of the shock absorbing laminate 100 can be reduced).

Figure 1C:
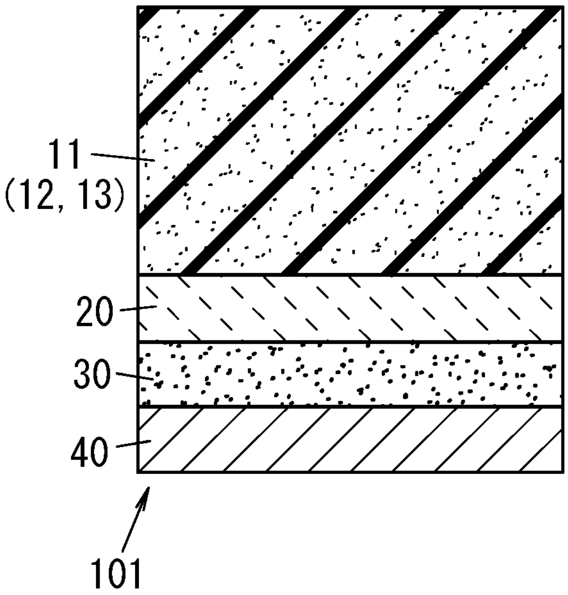
FIG. 1C is a view schematically illustrating another example of the shock absorbing laminate of the embodiment according to the present disclosure.

FIG. 1C shows a shock absorbing laminate 101 according to the present embodiment. The shock absorbing laminate 101 includes: a shock absorbing layer 11 having an adhesive property, a stress relieving property, and a light shielding property; a heat diffusion layer 20, and a shield layer 40. The shock absorbing laminate 101 optionally includes a bonding layer 30.

Figure 1D:
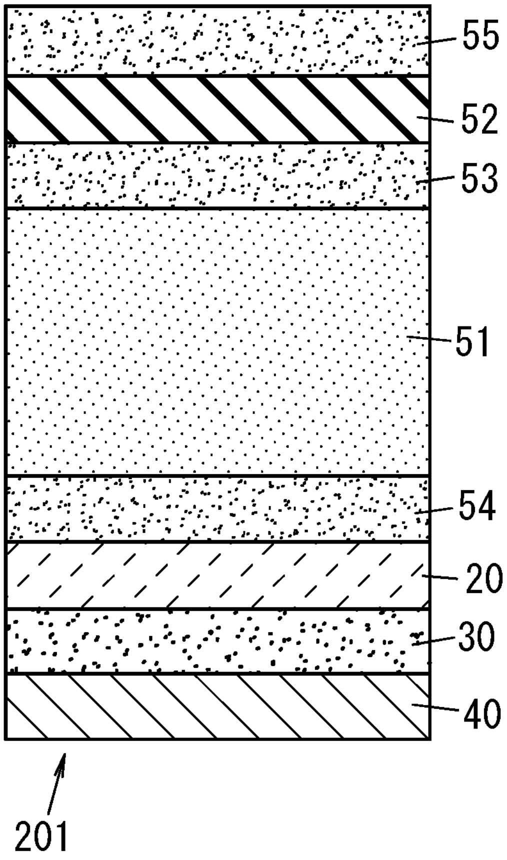
FIG. 1D is a view illustrating another example of the shock absorbing laminate of the comparative example.

FIG. 1D shows a shock absorbing laminate 201 for obtaining substantially the same degree of shock absorbency, light shielding property, and affixing property as the shock absorbing laminate 101. The shock absorbing laminate 201 has the same layers as those of the shock absorbing laminate 200 and additionally includes a light shielding base material 52 having low light transmittance in order to further obtain the light shielding property. The light shielding base material 52 has a thickness in the range from 5 μm to 50 μm inclusive and is affixed to one surface of a porous structure layer 51 via an adhesive layer 53 having a thickness in the range from 3 μm to 50 μm inclusive. The shock absorbing laminate 201 further includes two adhesive layers 54 and 55 each having a thickness in the range from 3 μm to 50 μm inclusive to obtain the affixing property. The adhesive layer 54 is provided on the other surface (a surface to which the light shielding base material 52 is not provided) of the porous structure layer 51. The adhesive layer 55 is provided on one surface (a surface to which the adhesive layer 53 is not provided) of the light shielding base material 52. A heat diffusion layer 20 is bonded to the adhesive layer 54. The heat diffusion layer 20 has one surface provided with a bonding layer 30, and a shield layer 40 is bonded to one surface of the bonding layer 30.

As described above, the shock absorbing laminate 201 includes: the porous structure layer 51 for obtaining the shock absorbency; the light shielding base material 52 for obtaining the light shielding property; the two adhesive layers 54 and 55 for obtaining the affixing property; and the adhesive layer 53 for bonding the light shielding base material 52 to the porous structure layer 51. Thus, the shock absorbing laminate 201 has a significantly increased thickness. In contrast, the shock absorbing laminate 101 according to the present embodiment includes the shock absorbing layer 11 having the adhesive property, the stress relieving property, and the light shielding property, and therefore, the shock absorbing layer 11 provides the shock absorbency, the affixing property, and the light shielding property. Thus, the shock absorbing laminate 101 includes none of the light shielding base material 52 and the three adhesive layers 53, 54, and 55 but has substantially the same extent of the shock absorbency, the light shielding property, and the affixing property as the shock absorbing laminate 201. Thus, the shock absorbing laminate 101 according to the present embodiment has the shock absorbency, the light shielding property, and the affixing property while having a smaller thickness than the shock absorbing laminate 201 (the thickness of the shock absorbing laminate 101 can be reduced).

Each of the shock absorbing laminates 100 and 101 according to the present embodiment is used by being disposed on a back surface of a display device. Thus, the shock absorbing laminate has to have the light shielding property so that components and the like provided on an opposite side of the shock absorbing laminate from the display device are not visually perceivable through the shock absorbing laminate from a display device-side. The light shielding property is provided by the heat diffusion layer and the shield layer included in the shock absorbing laminate, and therefore, in the case of a general display device, the shock absorbing layer does not have to have the light shielding property, but including a black pigment into the shock absorbing layer can achieve an improved design property, such as a high contrast, of the display device, and the design property can be further improved by increasing the jet-blackness of the black pigment.

[Shock Absorbing Layer]

The shock absorbing layer 10 has an adhesive property and a stress relieving property. The shock absorbing layer 10 includes an adhesive agent composition 2. The sock absorbing layer 10 has a thickness of greater than or equal to 40 μm and less than or equal to 500 μm.

Figure 2A:
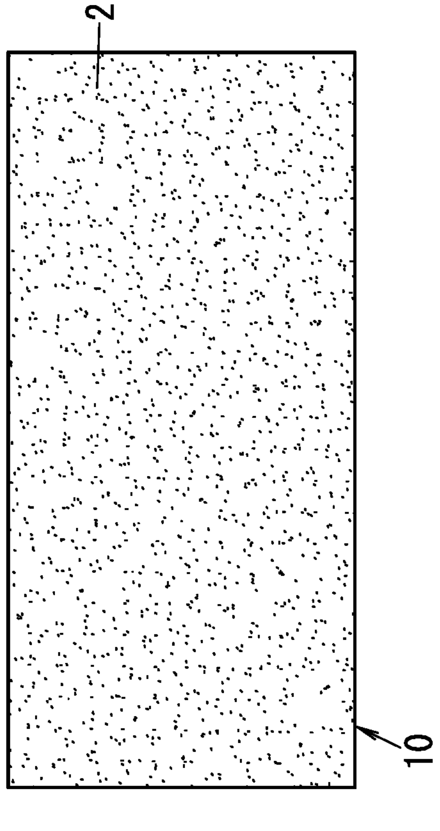
FIG. 2A is a view schematically illustrating an example of a shock absorbing layer of the shock absorbing laminate of the embodiment according to the present disclosure.
Figure 2B:
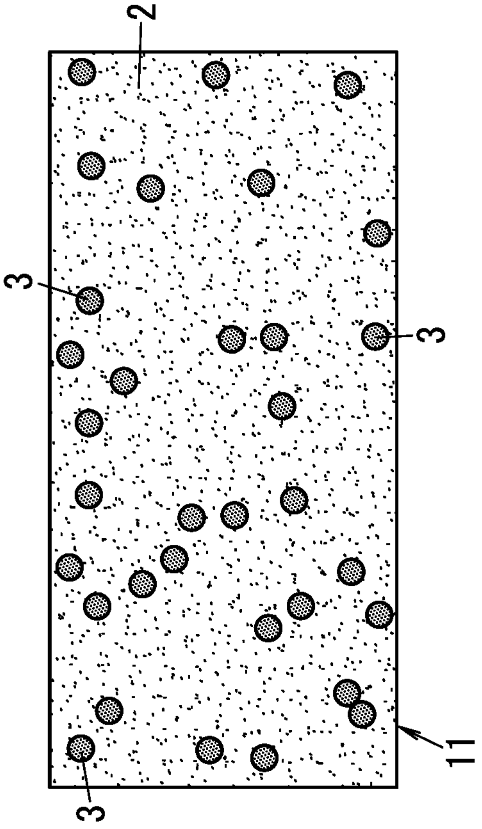
FIG. 2B is a view schematically illustrating another example of the shock absorbing layer.
Figure 2C:
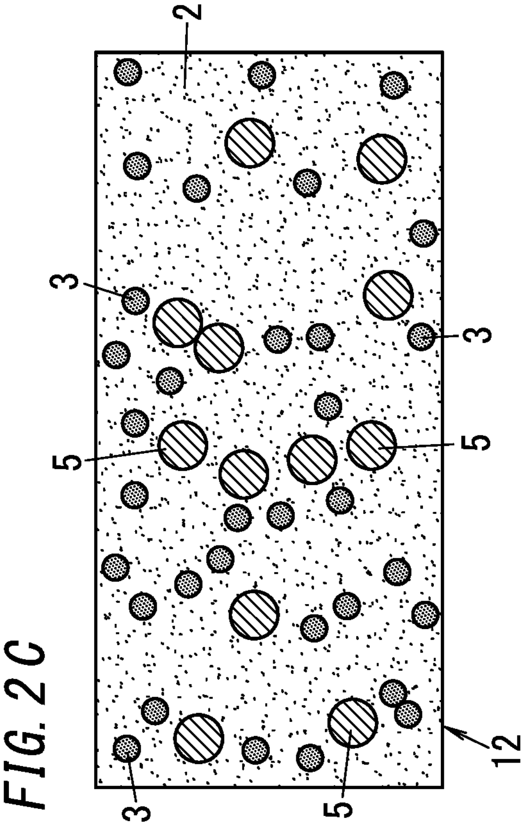
FIG. 2C is a view schematically illustrating still another example of the shock absorbing layer.
Figure 2D:
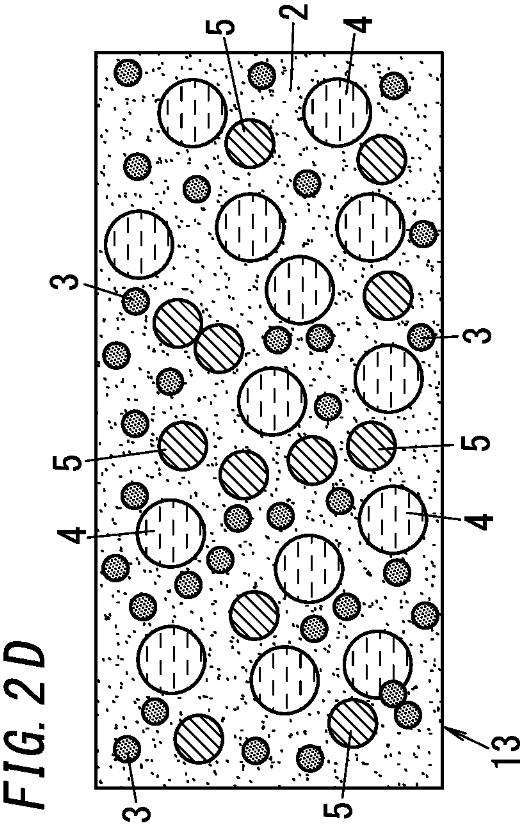
FIG. 2D is a view schematically illustrating yet another example of the shock absorbing layer.

As illustrated in FIG. 2A, the shock absorbing layer 10 includes the adhesive agent composition 2, but in place of the shock absorbing layer 10, the shock absorbing layer 11 including an adhesive agent composition 2 and a pigment 3 as illustrated in FIG. 2B may be used, or a shock absorbing layer 12 including an adhesive agent composition 2, a pigment 3, and additionally, heat dissipation fine particles 5 as illustrated in FIG. 2C may be used. Alternatively, a shock absorbing layer 13 including an adhesive agent composition 2, a pigment 3, heat dissipation fine particles 5, and additionally, liquid enclosing capsules 4 as illustrated in FIG. 2D may be used.

(Adhesive Agent Composition)

The adhesive agent composition 2 constitutes a main body of each of the shock absorbing layers 10 to 13. That is, the adhesive agent composition 2 has a function like a matrix that holds the pigment 3, the liquid enclosing capsules 4, and the heat dissipation fine particles 5 therein. In addition, the shock absorbing layers 10 to 13 does not have a porous structure but can physically relieve shock energy mainly by the adhesive agent composition 2. Here, saying that the adhesive agent composition 2 constitutes a main body of each of the shock absorbing layers 10 to 13 means that each of the shock absorbing layers 10 to 13 contains the adhesive agent composition 2 in an amount of greater than or equal to 50 mass %, preferably greater than or equal to 60 mass %, more preferably greater than or equal to 70% of the total mass thereof.

In the shock absorbing layers 10 to 13 according to the present embodiment, the adhesive agent composition 2 is in the form of a sheet, a plate, or a film. The adhesive agent composition 2 in any of such forms has a thickness of greater than or equal to 40 μm and less than or equal to 500 μm. That is, the thickness of the adhesive agent composition 2 is the thickness of each of the shock absorbing layers 10 to 13.

The adhesive agent composition 2 has an adhesive property. Here, the adhesive property means a property that enables the adhesive agent composition 2 and each of the shock absorbing layers 10 to 13 to be bonded to another.

Specifically, the adhesive property is defined by 180-degree peeling adhesive force in the case of a glass pane used as an adherend in an adhesive force test compliant with JIS Z0237 "Testing methods of pressure-sensitive adhesive tapes and sheets". The adhesive force of the adhesive agent composition 2 is preferably greater than or equal to 1 N/20 mm, more preferably greater than or equal to 2 N/20 mm, much more preferably greater than or equal to 10 N/20 mm. The adhesive force of the adhesive agent composition 2 is preferably as great as possible, but the adhesive force of at least 25 N/20 mm is sufficient.

The adhesive agent composition 2 has a stress relieving property. Here, the stress relieving property means a function of: converting, when stress is applied to the adhesive agent composition 2, shock energy caused by the stress into deformation or thermal energy; and absorbing the energy so that the stress is difficultly transmitted. Specifically, the adhesive agent composition 2 having the stress relieving property has a storage elastic modulus representing any value within the range from $10^3$ Pa to $10^5$ Pa inclusive and a tan δ representing any value within the range from $10^{-2}$ to 1 inclusive at any temperature between 25° C. and 100° C. inclusive.

The dynamic elastic modulus includes a storage elastic modulus G'(Pa) and a loss elastic modulus G"(Pa). Of energy generated in an object by external force and a strain, a component to be stored in the object
is the storage elastic modulus G'(Pa) and a component to be diffused to the outside of the object is the loss elastic modulus G"(Pa). Moreover, the tan δ is referred to as a loss coefficient and is the ratio of G" to G' (tan δ=G"/G'=loss elastic modulus/storage elastic modulus).

The storage elastic modulus G'(Pa) has any value within the range from $10^3$ Pa to $10^5$ Pa inclusive, and the tan δ has any value within the range from $10^{-2}$ to 1 inclusive at any temperature between 25° C. and 100° C. inclusive, and thereby, when the adhesive agent composition 2 receives external force, a strain, or the like, the adhesive agent composition 2 can exhibit the characteristic that the adhesive agent composition 2 once stores the energy of the external force or the like therein and then gradually diffuses the energy as thermal energy to the outside thereof, and thereby exhibiting shock absorbing characteristics. When the storage elastic modulus G'(Pa) and the tan δ have values outside the respective ranges described above, the adhesive agent composition 2 generates elastic repulsive force toward the outside without storing the energy of the external force, the strain, or the like therein or is plastically deformed, and therefore, the shock absorbing layers 10 to 13 hardly maintain their original shapes.

The adhesive agent composition 2 more preferably has a storage elastic modulus G'(Pa) having any value within the range from $10^4$ Pa to $10^5$ Pa inclusive and a tan δ having any value within the range from $10^{-1}$ to 1 inclusive at any temperature between 25° C. and 100° C. inclusive.

Note that as a measurement device for measuring the storage elastic modulus G'(Pa) and the loss elastic modulus G"(Pa), for example, "ARES G2" manufactured by TA Instruments Japan Inc. is used.

The adhesive agent composition applied to each of the shock absorbing layers 10 to 13 of the present embodiment preferably has an Asker C hardness of greater than or equal to 10 and less than or equal to 50, where the Asker C hardness is specified by a measurement method compliant with the standard (SRIS0101) of the Society of Rubber Science and Technology, Japan. When the adhesive agent composition has an Asker C hardness of less than 10, the shock absorbing layers 10 to 13 thus obtained are excessively soft, so that application of a shock significantly deforms the shock absorbing layers in a thickness direction (shock application direction), and the shock absorbing layers thus get into a so-called bottom-hitting state, thereby significantly reducing a shock buffering effect. In contrast, when the adhesive agent composition has an Asker C hardness of greater than 55, the shock absorbing layers 10 to 13 thus obtained are hard, so that bottom-hitting is avoided, but the repulsive force from the shock absorbing layers 10 to 13 at the application of a shock is large, thereby reducing the shock buffering effect. The adhesive agent composition 2 having the adhesive property and the stress relieving property constitutes the main body of each of the shock absorbing layers 10 to 13, and therefore, the shock absorbing layers 10 to 13 each having an adhesive property and a stress relieving property.

(Production Method and Constituent Components of Adhesive agent Composition)

The shock absorbing layers 10 to 13 in the present embodiment each include the adhesive agent composition 2. The adhesive agent composition 2 is a cured material of a resin such as a base polymer. The adhesive agent composition 2 is produced by, for example, drying a solution containing the base polymer after application of the solution, and curing the solution in a state where a solvent and an unnecessary low-molecular-weight component are removed from the solution.

<Base Polymer>

The base polymer included in the adhesive agent composition is preferably at least one kind of resin selected from a urethane-based resin, an acrylic-based resin, a rubber-based resin, and a silicone-based resin. The base polymer is more preferably the urethane-based resin or the silicone-based resin because these resins can further provide the effect of the present embodiment.

[Urethane-Based Resin]

As the urethane-based resin, any appropriate urethane-based resin can be adopted as long as the effect of the present embodiment is not impaired.

The urethane-based resin is preferably a urethane-based resin formed of a composition containing a polyol (A) and a polyfunctional isocyanate compound (B) or a urethane-based resin formed of a composition containing a urethane prepolymer (C) and the polyfunctional isocyanate compound (B). Adopting the resin as described above as the urethane-based resin improves the wettability of the shock absorbing layers 10 to 13 as an adhesive agent to an adherend, and thus, affixing to the adherend without involving air bubbles becomes possible.

The urethane-based resin can contain any appropriate component as long as the effect of the present embodiment is not impaired. Examples of such a component include: resin components other than the urethane-based resin; tackifiers; inorganic fillers; organic fillers; metal powder; pigments; foils; softeners; anti-aging agents, conductive agents; ultraviolet absorbing agents; antioxidants, light stabilizers; surface lubricant agents; levelling agents; corrosion inhibitors; heat stabilizers, polymerization inhibitors; glidants; solvents; and catalysts. The urethane-based resin preferably contains a deterioration inhibitor such as an antioxidant, an ultraviolet absorbing agent, and a light stabilizer.

One kind of deterioration inhibitor may be contained, or two or more kinds of deterioration inhibitors may be contained. The deterioration inhibitor is particularly preferably an antioxidant. Examples of the antioxidant include a radical chain inhibitor and a peroxide decomposer. Examples of the radical chain inhibitor include a phenolic antioxidant and an aminic antioxidant. Examples of the peroxide decomposer include a sulfur-based antioxidant and a phosphorus-based antioxidant. Examples of the phenolic antioxidant include a monophenolic antioxidant, a bisphenolic antioxidant, and a polymer phenolic antioxidant.

Examples of the monophenolic antioxidant include 2,6-di-t-butyl-p-cresol, butylated hydroxy anisole, 2,6-di-t-butyl-4-ethyl phenol, and stearin-β-(3,5-di-t-butyl-4-hydroxyphenyl)propionate. Examples of the bisphenolic antioxidant include 2,2'-methylenebis(4-methyl-6-t-butylphenol), 2,2'-methylenebis(4-ethyl-6-t-butylphenol), 4,4'-thiobis(3-methyl-6-t-butylphenol), 4,4'-butylidene bis (3-methyl-6-t-butylphenol), and 3,9-bis[1,1-dimethyl-2-[β-(3-t-butyl-4-hydroxy-5-methylphenyl)propionyloxy]ethyl] 2,4,8,10-tetr aoxaspiro[5,5]undecane.

Examples of the polymer phenolic antioxidant include 1,1,3-tris(2-methyl-4-hydroxy-5-t-butylphenyl)butane, 1,3,5-trimethyl-2,4,6-tris(3,5-di-t-butyl-4-hydroxybenzil)benzene, tetrakis-[methylene-3-(3',5'-di-t-butyl-4'-hydroxy phenyl)propionate]methane, bis[3,3'-bis-(4'-hydroxy-3'-t-butyl phenyl)butyric acid]glycol ester, 1,3,5-tris(3',5'-di-t-butyl-4'-hydroxybenzil)-S-triazine-2,4,6-(1H, 3H, 5H)trione, and tocopherol.

Examples of the sulfur-based antioxidant include dilauryl 3,3'-thiodipropionate, dimyristyl 3,3'-thiodipropionate, and distearyl 3,3'-thiodipropionate. Examples of the phosphorus-based antioxidant include triphenyl phosphite, diphenyl isodecyl phosphite, and phenyl diisodecyl phosphite. Examples of the ultraviolet absorbing agent include a benzophenone-based ultraviolet absorbing agent, a benzo triazole-based ultraviolet absorbing agent, a salicylic acid-based ultraviolet absorbing agent, an oxalanilide-based ultraviolet absorbing agent, a cyanoacrylate-based ultraviolet absorbing agent, and a triazine-based ultraviolet absorbing agent.

Examples of the benzophenone-based ultraviolet absorbing agent include 2,4-dihydroxy benzophenone, 2-hydroxy-4-methoxy benzophenone, 2-hydroxy-4-octyloxybenzophenone, 2-hydroxy-4-dodecyl oxy benzophenone, 2,2'-dihydroxy-4-dimethoxy benzophenone, 2,2'-dihydroxy-4,4'-dimethoxy benzophenone, 2-hydroxy-4-methoxy-5-sulfobenzophenone, and bis(2-methoxy-4-hydroxy-5-benzoylphenyl)methane.

Examples of the benzo triazole-based ultraviolet absorbing agent include 2-(2'-hydroxy-5'-methyl phenyl)benzo triazole, 2-(2'-hydroxy-5'-tert-butyl phenyl)benzo triazole, 2-(2'-hydroxy-3',5'-di-tert-butyl phenyl)benzo triazole, 2-(2'-hydroxy-3'-tert-butyl-5'-methyl phenyl)-5-chlorobenzotriazole, 2-(2'-hydroxy-3',5'-di-tert-butyl phenyl)5-chlorobenzotriazole, 2-(2'-hydroxy-3',5'-di-tert-amyl phenyl) benzo triazole, 2-(2'-hydroxy-4'-octoxyphenyl)benzo triazole, 2-[2'-hydroxy-3'-(3",4",5",6"-tetrahydro phthalimide methyl)-5'-methyl phenyl]benzo triazole, 2,2'-methylenebis[4-(1,1,3,3-tetra methyl butyl)-6-(2H-benzo triazole-2-il)phenol], and 2-(2'-hydroxy-5'-methacryloxyphenyl)-2H-benzo triazole.

Examples of the salicylic acid-based ultraviolet absorbing agent include phenyl salicylate, p-tert-butyl phenyl salicylate, and p-octyl phenyl salicylate. Examples of the cyanoacrylate-based ultraviolet absorbing agent include 2-ethylhexyl-2-cyano-3,3'-diphenylacrylate, and ethyl-2-cyano-3,3'-diphenylacrylate.

Examples of the light stabilizer include a hindered amine-based light stabilizer, and an ultraviolet stabilizer. Examples of the hindered amine-based light stabilizer include bis(2,2,6,6-tetramethyl-4-piperidyl)sebacate, bis(1,2,2,6,6-pentamethyl-4-piperidyl)sebacate, and methyl-1,2,2,6,6-pentamethyl-4-piperidyl sebacate. Examples of the ultraviolet stabilizer include nickel bis(octyl phenyl)sulfide, [2,2'-thiobis(4-tert-octyl phenolate)]-n-butyl amine nickel, nickel complex-3,5-di-tert-butyl-4-hydroxybenzyl-phosphoric acid monoethylate, nickel-dibutyl dithiocarbamate, a benzoate-type quencher, and nickel-dibutyl dithiocarbamate.

(Urethane-based Resin Formed of Composition Containing Polyol (A) and Polyfunctional Isocyanate Compound (B))

The urethane-based resin formed of the composition containing the polyol (A) and the polyfunctional isocyanate compound (B) is specifically preferably a urethane-based resin obtained by curing the composition containing the polyol (A) and the polyfunctional isocyanate compound (B). One kind of polyol (A) may be contained, or two or more kinds of polyols (A) may be contained. One kind of polyfunctional isocyanate compound (B) may be contained, or two or more kinds of polyfunctional isocyanate compounds (B) may be contained.

Examples of the polyol (A) preferably include polyester polyol, polyether polyol, polycaprolactone polyol, polycarbonate polyol, and castor oil-based polyol. As the polyol (A), the polyether polyol is more preferable. The polyester polyol can be obtained by, for example, esterification reaction between a polyol component and an acid component. Examples of the polyol component include ethylene glycol, diethylene glycol, 1,3-butane diol, 1,4-butane diol, neopentyl glycol, 3-methyl-1,5-pentane diol, 2-butyl-2-ethyl-1,3-propane diol, 2,4-diethyl-1,5-pentane diol, 1,2-hexane diol, 1,6-hexane diol, 1,8-octane diol, 1,9-nonane diol, 2-methyl-1,8-octane diol, 1,8-decanediol, octadecanediol, glycerol, trimethylol propane, pentaerythritol, hexane triol, and polypropylene glycol.

Examples of the acid component include succinic acid, methyl succinic acid, adipic acid, pimelic acid, azelaic acid, sebacic acid, 1,12-dodecanedioic acid, 1,14-tetradecanedioic acid, dimer acid, 2-methyl-1,4-cyclohexane dicarboxylic acid, 2-ethyl-1,4-cyclohexane dicarboxylic acid, terephthalic acid, isophthalic acid, phthalic acid, isophthalic acid, terephthalic acid, 1,4-naphthalene dicarboxylic acid, 4,4'-biphenyl dicarboxylic acid, and acid anhydrides thereof.

Examples of the polyether polyol include polyether polyol obtained by addition polymerization of alkylene oxide such as ethylene oxide, propylene oxide, or butylene oxide by using water, low molecular polyol (e.g., propylene glycol, ethylene glycol, glycerol, trimethylol propane, pentaerythritol), bisphenols (e.g., bisphenol A), dihydroxy benzene (e.g., catechol, resorcin, hydroquinone), or the like as an initiator. Specific examples of the polyether polyol include polyethylene glycol, polypropylene glycol, and polytetramethylene glycol.

Examples of the polycaprolactone polyol include caprolactone-based polyester diol obtained by ring-opening polymerization of an annular ester monomer such as ε-caprolactone and σ-valerolactone.

Examples of the polycarbonate polyol include a polycarbonate polyol obtained by polycondensation reaction of the polyol component with phosgene; a polycarbonate polyol obtained by transesterification condensation of the polyol component and diester carbonates such as dimethyl carbonate, diethyl carbonate, dipropyl carbonate, diisopropyl carbonate, dibutyl carbonate, ethyl butyl carbonate, ethylene carbonate, propylene carbonate, diphenyl carbonate, and dibenzyl carbonate; a copolymerization polycarbonate polyol obtained by using two or more kinds of the polyol components together; polycarbonate polyols obtained by esterification reaction of a carboxyl group-containing compound with the respective polycarbonate polyols; polycarbonate polyols obtained by esterification reaction of a hydroxy group-containing compound with the respective polycarbonate polyols; polycarbonate polyols obtained by ester interchange reaction of an ester compound with the respective polycarbonate polyols; polycarbonate polyols obtained by ester interchange reaction of a hydroxy group-containing compound with the respective polycarbonate polyols; polyester-based polycarbonate polyols obtained by polycondensation reaction of a dicarboxylic acid compound with the respective polycarbonate polyols; and copolymerization polyether-based polycarbonate polyols obtained by copolymerization of the respective polycarbonate polyols with alkylene oxide.

Examples of the castor oil-based polyol include a castor oil-based polyol obtained by reacting castor oil fatty acid with the polyol component. Specific examples of the castor oil-based polyol include a castor oil-based polyol obtained by reacting castor oil fatty acid with polypropylene glycol.

The number average molecular weight Mn of the polyol (A) is preferably greater than or equal to 300 and less than or equal to 100000, more preferably greater than or equal to 400 and less than or equal to 75000, much more preferably greater than or equal to 450 and less than or equal to 50000, particularly preferably greater than or equal to 500 and less than or equal to 30000. Adjusting the number average molecular weight Mn of the polyol (A) to be within the above-mentioned range can improve the wettability of the shock absorbing layer as an adhesive agent to an adherend and thus, affixing to the adherend without involving air bubbles becomes possible.

The polyol (A) preferably contains a polyol (A1) including three OH groups and having a number average molecular weight Mn of greater than or equal to 300 and less than or equal to 100000. One kind of polyol (A1) may be contained, or two or more kinds of polyols (A1) may be contained. The content ratio of the polyol (A1) in the polyol (A) is preferably greater than or equal to 5 wt. %, more preferably greater than or equal to 25 wt. % and less than or equal to 100 wt. %, much more preferably greater than or equal to 50 wt. % and less than or equal to 100 wt. %. Adjusting the content ratio of the polyol (A1) in the polyol (A) to be within the above-mentioned range can improve the wettability of the shock absorbing layer as an adhesive agent to an adherend and thus, affixing to the adherend without involving air bubbles becomes possible. The number average molecular weight Mn of the polyol (A1) is preferably greater than or equal to 1000 and less than or equal to 100000, more preferably greater than or equal to 1200 and less than or equal to 80000, much more preferably greater than or equal to 1500 and less than or equal to 70000, further preferably greater than or equal to 1750 and less than or equal to 50000, particularly preferably greater than or equal to 1500 and less than or equal to 40000, most preferably greater than or equal to 2000 and less than or equal to 30000. Adjusting the number average molecular weight Mn of the polyol (A1) to be within the above-mentioned range can improve the wettability of the shock absorbing layer as an adhesive agent to an adherend and thus, affixing to the adherend without involving air bubbles becomes possible.

The polyol (A) may contain a polyol (A2) having three or more OH groups and having a number average molecular weight Mn of less than or equal to 20000. One kind of polyol (A2) may be contained, or two or more kinds of polyols (A2) may be contained. The number average molecular weight Mn of the polyol (A2) is preferably greater than or equal to 100 and less than or equal to 20000, more preferably greater than or equal to 150 and less than or equal to 10000, much more preferably greater than or equal to 200 and less than or equal to 7500, particularly preferably greater than or equal to 300 and less than or equal to 6000, most preferably greater than or equal to 300 and less than or equal to 5000. The total amount of at least one kind of a polyol (tetraol) including four OH groups, a polyol (pentaol) including five OH groups, or a polyol (hexaol) including six OH groups as the polyol (A2) is preferably less than or equal to 70 wt. %, more preferably less than or equal to 60 wt. %, much more preferably less than or equal to 40 wt. %, and particularly preferably less than or equal to 30 wt. % as the content ratio in the polyol (A).

Adjusting the at least one kind of a polyol (tetraol) including four OH groups, a polyol (pentaol) including five OH groups, or a polyol (hexaol) including six OH groups as the polyol (A2) as the polyol (A2) to be within the above-described range in the polyol (A) can provide a urethane-based resin having excellent transparency, and in addition, can improve the wettability of the shock absorbing layer as an adhesive agent to an adherend and thus, affixing to the adherend without involving air bubbles becomes possible.

One kind of polyfunctional isocyanate compound (B) may be contained, or two or more kinds of polyfunctional isocyanate compounds (B) may be contained. As the polyfunctional isocyanate compound (B), any appropriate polyfunctional isocyanate compound usable for urethanization reaction can be adopted. Examples of the polyfunctional isocyanate compound (B) include a polyfunctional aliphatic-based isocyanate compound, polyfunctional alicyclic isocyanate, and a polyfunctional aromatic isocyanate compound.

Examples of the polyfunctional aliphatic-based isocyanate compound include trimethylene diisocyanate, tetramethylene diisocyanate, hexamethylene diisocyanate, pentamethylene diisocyanate, 1,2-propylene diisocyanate, 1,3-butylene diisocyanate, dodecamethylene diisocyanate, and 2,4,4-trimethyl hexamethylene diisocyanate.

Examples of the polyfunctional alicyclic isocyanate compound include 1,3-cyclopentene diisocyanate, 1,3-cyclohexane diisocyanate, 1,4-cyclohexane diisocyanate, isophorone diisocyanate, hydrogenated diphenyl methane diisocyanate, hydrogenated xylylene diisocyanate, hydrogenated tolylene diisocyanate, and hydrogenated tetra methyl xylylene diisocyanate.

Examples of the polyfunctional aromatic diisocyanate compound include phenylene diisocyanate, 2,4-tolylene diisocyanate, 2,6-tolylene diisocyanate, 2,2'-diphenyl methane diisocyanate, 4,4'-diphenyl methane diisocyanate, 4,4'-toluidine diisocyanate, 4,4'-diphenyl ether diisocyanate, 4,4'-diphenyl diisocyanate, 1,5-naphthalene diisocyanate, and xylylene diisocyanate.

Examples of the polyfunctional isocyanate compound (B) also include a trimethylol propane adduct product of the various kinds of polyfunctional isocyanate compounds, a biuret product reacted with water, and a trimer including an isocyanurate ring. Moreover, these compounds may be used in combination.

In the polyol (A) and the polyfunctional isocyanate compound (B), the equivalent ratio of NCO group to OH group as NCO group/OH group is preferably less than or equal to 5.0, more preferably greater than or equal to 0.1 and less than or equal to 3.0, much more preferably greater than or equal to 0.2 and less than or equal to 2.5, particularly preferably greater than or equal to 0.3 and less than or equal to 2.25, most preferably greater than or equal to 0.5 and less than or equal to 2.0. Adjusting the equivalent ratio of NCO group/OH group to be within the above-mentioned range can improve the wettability of the shock absorbing layer as an adhesive agent to an adherend and thus, affixing to the adherend without involving air bubbles becomes possible.

Regarding the content ratio of the polyfunctional isocyanate compound (B) to the polyol (A), the polyfunctional isocyanate compound (B) is preferably greater than or equal to 1.0 wt. % and less than or equal to 30 wt. %, more preferably greater than or equal to 1.5 wt. % and less than or equal to 27 wt. %, much more preferably greater than or equal to 2.0 wt. % and less than or equal to 25 wt. %, particularly preferably from 2.3 wt. % to 23 wt. %, most preferably greater than or equal to 2. 5 wt. % and less than or equal to 20 wt. %. Adjusting the content ratio of polyfunctional isocyanate compound (B) to be within the above-mentioned range can improve the wettability of the shock absorbing layer as an adhesive agent to an adherend and thus, affixing to the adherend without involving air bubbles becomes possible. The polyurethane-based resin is specifically preferably formed by curing a composition containing the polyol (A) and the polyfunctional isocyanate compound (B). As a method for forming the urethane-based resin by curing the composition containing the polyol (A) and the polyfunctional isocyanate compound (B), any appropriate method, such as a urethanization reaction method by bulk polymerization, solution polymerization, or the like, may be adopted as long as the effect of the present embodiment is not impaired.

To cure the composition containing the polyol (A) and the polyfunctional isocyanate compound (B), a catalyst is preferably used. Examples of the catalyst include an organic metal-based compound and a tertiary amine compound. Examples of the organic metal-based compound include an iron-based compound, a tin-based compound, a titanium-based compound, a zirconium-based compound, a lead-based compound, a cobalt-based compound, and a zinc-based compound. Among these compounds, the iron-based compound and the tin-based compound are preferable in terms of reaction speed and the pot life of an adhesive agent layer.

Examples of the iron-based compound include iron acetylacetonate and iron 2-ethylhexanoate. Examples of the tin-based compound include dibutyltin dichloride, dibutyltin oxide, dibutyltin dibromide, dibutyltin maleate, dibutyltin dilaurate, dibutyltin diacetate, dibutyltin sulfide, tributyltin methoxide, tributyltin acetate, triethyltin ethoxide, tributyltin ethoxide, dioctyltin oxide, dioctyltin dilaurate, tributyltin chloride, tributyltin trichloroacetate, and tin 2-ethylhexanoate.

Examples of the titanium-based compound include dibutyl titanium dichloride, tetra butyl titanate, and butoxy titanium trichloride. Examples of the zirconium-based compound include zirconium naphthenate, and zirconium acetylacetonate. Examples of the lead-based compound include lead oleate, lead 2-ethylhexanoate, lead benzoate, and lead naphthenate. Examples of the cobalt-based compound include cobalt 2-ethylhexanoate and cobalt benzoate. Examples of the zinc-based compound include zinc naphthenate and zinc 2-ethylhexanoate. Examples of the tertiary amine compound include triethyl amine, triethylene diamine, and 1,8-diazabicyclo-(5,4,0)-undecene-7.

One kind of catalyst may be contained, or two or more kinds of catalysts may be contained. Moreover, the catalyst may be used in combination with a crosslinking retardant and the like. The amount of the catalyst to the polyol (A) is preferably greater than or equal to 0.005 wt. % and less than or equal to 1.00 wt. %, more preferably greater than or equal to 0.01 wt. % and less than or equal to 0.75 wt. %, much more preferably greater than or equal to 0.01 wt. % and less than or equal to 0.50 wt. %, particularly preferably greater than or equal to 0.01 wt. % and less than or equal to 0.20 wt. %. Adjusting the amount of the catalyst to be within the above-mentioned range can improve the wettability of the shock absorbing layer as an adhesive agent to an adherend and thus, affixing to the adherend without involving air bubbles becomes possible.

The composition containing the polyol (A) and the polyfunctional isocyanate compound (B) may contain any other appropriate component as long as the effect of the present embodiment is not impaired. Examples of the any other appropriate component include: resin components other than the urethane-based resin; tackifiers; inorganic fillers; organic fillers; metal powder; pigments; foils; softeners; anti-aging agents, conductive agents; ultraviolet absorbing agents; antioxidants, light stabilizers; surface lubricant agents; levelling agents; corrosion inhibitors; heat stabilizers, polymerization inhibitors; glidants; solvents; and catalysts.

(Urethane-based Resin Formed of Composition Containing Urethane Prepolymer (C) and Polyfunctional Isocyanate Compound (B))

The urethane-based resin formed of the composition containing the urethane prepolymer (C) and the polyfunctional isocyanate compound (B) can adopt any appropriate urethane-based resin as long as the urethane-based resin is a urethane-based resin obtained by using a so-called "urethane prepolymer" as a raw material. Examples of the urethane-based resin formed of the composition containing the urethane prepolymer (C) and the polyfunctional isocyanate compound (B) include a urethane-based resin formed of a composition containing a polyurethane polyol as the urethane prepolymer (C) and the polyfunctional isocyanate compound (B). One kind of urethane prepolymer (C) may be contained, or two or more kinds of urethane prepolymers (C) may be contained. One kind of polyfunctional isocyanate compound (B) may be contained, or two or more kinds of polyfunctional isocyanate compounds (B) may be contained.

The polyurethane polyol as the urethane prepolymer (C) is preferably obtained by reaction of a polyester polyol (a1) or a polyether polyol (a2) alone, or a mixture of the polyester polyol (a1) and the polyether polyol (a2), with an organic polyisocyanate compound (a3) in the presence of a catalyst or without a catalyst.

As the polyester polyol (a1), any appropriate polyester polyol can be used. Examples of the polyester polyol (a1) include a polyester polyol obtained by reacting an acid component with a glycol component.

Examples of the acid component include terephthalic acid, adipic acid, azelaic acid, sebacic acid, phthalic anhydride, isophthalic acid, and trimellitic acid. Examples of the glycol component include ethylene glycol, propylene glycol, diethylene glycol, butylene glycol, 1,6-hexane glycol, 3-methyl-1,5-pentane diol, 3,3'-dimethylol heptane, polyoxyethylene glycol, polyoxypropylene glycol, 1,4-butane diol, neopentyl glycol, and butyl ethyl pentane diol, and examples of the polyol component include glycerol, trimethylol propane, and pentaerythritol. Other examples of the polyester polyol (a1) include a polyester polyol obtained by ring-opening polymerization of lactones such as polycaprolactone, poly(β-methyl-γ-valerolactone), and polyvalerolactone.

As the polyester polyol (a1), any of low to high molecular weight polyester polyols can be used. As the molecular weight of the polyester polyol (a1), the number average molecular weight is preferably greater than or equal to 100 and less than or equal to 100000. When the number average molecular weight is less than 100, reactiveness increases, and gelation may easily be caused. When the number average molecular weight is greater than 100000, reactiveness decreases, and in addition, the cohesion force of the polyurethane polyol itself may be poor. The usage amount of the polyester polyol (a1) is preferably greater than or equal to 0 mol % and less than or equal to 90 mol % in the polyol included in the polyurethane polyol.

As the polyether polyol (a2), any appropriate polyether polyol can be used. Examples of the polyether polyol (a2) include a polyether polyol obtained by polymerization of an oxirane compound such as ethylene oxide, propylene oxide, or butylene oxide, tetrahydrofuran by using a low molecular weight polyol such as water, propylene glycol, ethylene glycol, glycerol, or trimethylol propane as an initiator. Specific examples of the polyether polyol (a2) include a polyether polyol, such as polypropylene glycol, polyethylene glycol, and polytetramethylene glycol, having two or more functional groups. As the polyether polyol (a2), any of low to high molecular weight polyether polyols can be used. As the molecular weight of the polyether polyol (a2), the number average molecular weight is preferably greater than or equal to 100 and less than or equal to 100000. When the number average molecular weight is less than 100, reactiveness increases, and gelation may easily be caused. When the number average molecular weight is greater than 100000, reactiveness decreases, and in addition, the cohesion force of the polyurethane polyol itself may be poor.

The usage amount of the polyether polyol (a2) is preferably greater than or equal to 0 mol % and less than or equal to 90 mol % in the polyol included in the polyurethane polyol. The polyether polyol (a2) may be partially substituted, as necessary, with: glycols such as ethylene glycol, 1,4-butane diol, neopentyl glycol, butyl ethyl pentane diol, glycerol, trimethylol propane, and pentaerythritol; polyvalent amines such as ethylene diamine, N-amino ethyl ethanol amine, isophorone diamine, and xylylene diamine; or the like.

As the polyether polyol (a2), only a difunctional polyether polyol may be used, or some or all of polyether polyols each having a number average molecular weight of greater than or equal to 100 and less than or equal to 100000 and having at least three or more hydroxyl groups per molecule may be used. Using, as the polyether polyol (a2), some or all of polyether polyols each having a number average molecular weight of greater than or equal to 100 and less than or equal to 100000 and having at least three or more hydroxyl groups per molecule can provide satisfactory balance between adhesive force and redetachability. When in such a polyether polyol, the number average molecular weight is less than 100, reactiveness increases, and gelation may easily be caused. Moreover, in such a polyether polyol, when the number average molecular weight is greater than 100000, reactiveness decreases, and in addition, the cohesion force of the polyurethane polyol itself may be poor. The number average molecular weight of such a polyether polyol is more preferably greater than or equal to 100 and less than or equal to 10000.

As the organic polyisocyanate compound (a3), any appropriate organic polyisocyanate compound can be used. Examples of the organic polyisocyanate compound (a3) include aromatic polyisocyanate, aliphatic polyisocyanate, aromatic aliphatic polyisocyanate, and alicyclic polyisocyanate.

Examples of the aromatic polyisocyanate include 1,3-phenylene diisocyanate, 4,4'-diphenyl diisocyanate, 1,4-phenylene diisocyanate, 4,4'-diphenyl methane diisocyanate, 2,4-tolylene diisocyanate, 2,6-tolylene diisocyanate, 4,4'-toluidine diisocyanate, 2,4,6-triisocyanate toluene, 1,3,5-triisocyanate benzene, dianisidine diisocyanate, 4,4'-diphenyl ether diisocyanate, and 4,4',4"-triphenyl methane triisocyanate.

Examples of the aliphatic polyisocyanate include trimethylene diisocyanate, tetramethylene diisocyanate, hexamethylene diisocyanate, pentamethylene diisocyanate, 1,2-propylene diisocyanate, 2,3-butylene diisocyanate, 1,3-butylene diisocyanate, dodecamethylene diisocyanate, and 2,4,4-trimethyl hexamethylene diisocyanate.

Examples of the aromatic aliphatic polyisocyanate include ω,ω'-diisocyanate-1,3-dimethyl benzene, ω,ω'-diisocyanate-1,4-dimethyl benzene, w,&-diisocyanate-1,4-diethyl benzene, 1,4-tetra methyl xylylene diisocyanate, and 1,3-tetra methyl xylylene diisocyanate.

Examples of the alicyclic polyisocyanate include 3-isocyanate methyl-3,5,5-trimethyl cyclohexyl isocyanate, 1,3-cyclopentane diisocyanate, 1,3-cyclohexane diisocyanate, 1,4-cyclohexane diisocyanate, methyl-2,4-cyclohexane diisocyanate, methyl-2,6-cyclohexane diisocyanate, 4,4'-methylenebis(cyclohexyl isocyanate), 1,4-bis(isocyanate methyl) cyclohexane, and 1,4-bis(isocyanate methyl)cyclohexane.

As the organic polyisocyanate compound (a3), a trimethylol propane adduct product, a biuret product reacted with water, a trimer including an isocyanurate ring, and the like may be used in combination.

As the catalyst which can be used to obtain the polyurethane polyol, any appropriate catalyst can be used. Examples of such a catalyst include a tertiary amine-based compound and an organic metal-based compound. Examples of the tertiary amine-based compound include triethyl amine, triethylene diamine and 1,8-diazabicyclo(5,4,0)-undecene-7 (DBU). Examples of the organic metal-based compound include a tin-based compound and a non-tin-based compound.

Examples of the tin-based compound include dibutyltin dichloride, dibutyltin oxide, dibutyltin dibromide, dibutyltin dimaleate, dibutyltin dilaurate (DBTDL), dibutyltin diacetate, dibutyltin sulfide, tributyltin sulfide, tributyltin oxide, tributyltin acetate, triethyltin ethoxide, tributyltin ethoxide, dioctyltin oxide, tributyltin chloride, tributyltin trichloroacetate, and tin 2-ethylhexanoate.

Examples of the non-tin-based compound include: a titanium-based compound such as dibutyl titanium dichloride, tetra butyl titanate, and butoxy titanium trichloride; a lead-based compound such as lead oleate, lead 2-ethylhexanoate, lead benzoate, and lead naphthenate; an iron-based compound such as iron 2-ethylhexanoate and iron acetylacetonate; a cobalt-based compound such as cobalt benzoate and cobalt 2-ethylhexanoate; a zinc-based compound such as zinc naphthenate and zinc 2-ethylhexanoate; and a zirconium-based compound such as zirconium naphthenate.

When a catalyst is used to obtain the polyurethane polyol, problems such as gelation or clouding of a reaction solution are more likely to be caused in a system including a single kind of catalyst because in a system including two kinds of polyols, namely, the polyester polyol and the polyether polyol, reactivity differs between the two kinds of polyols. Thus, the two kinds of catalysts are used to obtain the polyurethane polyol, and thereby, control of the reaction speed, the selectivity of the catalysts, and the like becomes easy, thereby solving these problems. Examples of a combination of the two kinds of catalysts include tertiary amine/ organic metal-based catalysts, tin-based/non-tin-based catalysts, and tin-based/tin-based catalysts, preferably tin-based/tin-based catalysts, more preferably a combination of dibutyltin dilaurate and tin 2-ethylhexanoate. The blend ratio of tin 2-ethylhexanoate/dibutyltin dilaurate is preferably less than 1, more preferably, greater than or equal to 0.2 and less than or equal to 0.6 in the ratio by weight. When the blend ratio is greater than 1, the balance of catalyst activity may easily lead to gelation.

When a catalyst is used to obtain the polyurethane polyol, the usage amount of the catalyst to the total amount of the polyester polyol (a1), the polyether polyol (a2), and the organic polyisocyanate compound (a3) is preferably greater than or equal to 0.01 wt. % and less than or equal to 1.0 wt. %. When a catalyst is used to obtain the polyurethane polyol, the reaction temperature is preferably lower than 100° C., more preferably higher than or equal to 85° C. and lower than or equal to 95° C. When the reaction temperature is higher than 100° C., controlling the reaction speed and the crosslinking structure may become difficult, and thus, it may become difficult to obtain a polyurethane polyol having a prescribed molecular weight. The catalyst does not have to be used to obtain the polyurethane polyol. In this case, the reaction temperature is preferably higher than or equal to 100° C., more preferably higher than or equal to 110° C. Moreover, to obtain the polyurethane polyol without the catalyst, reaction is caused preferably for three hours or longer.

Examples of a method for obtaining the polyurethane polyol include a method 1) of putting a polyester polyol, a polyether polyol, a catalyst, and an organic polyisocyanate into a volumetric flask and a method 2) of putting a polyester polyol, a polyether polyol, and a catalyst into a flask to obtain a mixture and adding an organic polyisocyanate to the mixture by drops. As a method for obtaining the polyurethane polyol, the method 2) is preferable in terms of controlling of the reaction.

To obtain the polyurethane polyol, any appropriate solvent can be used. Examples of the solvent include methyl ethyl ketone, ethyl acetate, toluene, xylene, and acetone. Among these solvents, toluene is preferable. As the polyfunctional isocyanate compound (B), the compound as described above can be incorporated.

The composition containing the urethane prepolymer (C) and the polyfunctional isocyanate compound (B) may contain any other appropriate component as long as the effect of the present embodiment is not impaired. Examples of the any other appropriate component include: resin components other than the urethane-based resin; tackifiers; inorganic fillers; organic fillers; metal powder; pigments; foils; softeners; anti-aging agents, conductive agents; ultraviolet absorbing agents; antioxidants, light stabilizers; surface lubricant agents; levelling agents; corrosion inhibitors; heat stabilizers, polymerization inhibitors; glidants; solvents; and catalysts.

A method for producing the polyurethane-based resin formed of the composition containing the urethane prepolymer (C) and the polyfunctional isocyanate compound (B) can adopt any appropriate production method as long as the method is a method for producing a polyurethane-based resin by using a so-called "urethane prepolymer" as a raw material. The number average molecular weight Mn of the urethane prepolymer (C) is preferably greater than or equal to 3000 and less than or equal to 1000000. In the urethane prepolymer (C) and the polyfunctional isocyanate compound (B), the equivalent ratio of NCO group to OH group as NCO group/OH group is preferably less than or equal to 5.0, more preferably greater than or equal to 0.01 and less than or equal to 3.0, much more preferably greater than or equal to 0.02 and less than or equal to 2.5, particularly preferably greater than or equal to 0.03 and less than or equal to 2.25, most preferably greater than or equal to 0.05 and less than or equal to 2.0. Adjusting the equivalent ratio of NCO group/OH group to be within the above-mentioned range can improve the wettability of the shock absorbing layer as an adhesive agent to an adherend and thus, affixing to the adherend without involving air bubbles becomes possible.

Regarding the content ratio of the polyfunctional isocyanate compound (B) to the urethane prepolymer (C), the content of the polyfunctional isocyanate compound (B) is preferably greater than or equal to 0.01 wt. % and less than or equal to 30 wt. %, more preferably greater than or equal to 0.03 wt. % and less than or equal to 20 wt. %, much more preferably greater than or equal to 0.05 wt. % and less than or equal to 15 wt. %, particularly preferably greater than or equal to 0.075 wt. % and less than or equal to 10 wt. %, most preferably greater than or equal to 0.1 wt. % and less than or equal to 8 wt. %. Adjusting the content ratio of polyfunctional isocyanate compound (B) to be within the above-mentioned range can improve the wettability of the shock absorbing layer as an adhesive agent to an adherend and thus, affixing to the adherend without involving air bubbles becomes possible.

[Acrylic-Based Resin]

As the acrylic-based resin, any appropriate acrylic-based tackifier, such as a publicly known acrylic-based tackifier as described in, for example, JP 2013-241606 A can be used as long as the effect of the present embodiment is not impaired. The acrylic-based resin can contain any appropriate component as long as the effect of the present embodiment is not impaired. Examples of such a component include: resin components other than the acrylic-based resin; tackifiers; inorganic fillers; organic fillers; metal powder; pigments; foils; softeners; anti-aging agents, conductive agents; ultraviolet absorbing agents; antioxidants, light stabilizers; surface lubricant agents; levelling agents; corrosion inhibitors; heat stabilizers, polymerization inhibitors; glidants; solvents; and catalysts.

[Rubber-Based Resin]

As the rubber-based resin, any appropriate rubber-based tackifier, such as a publicly known rubber-based tackifier as described in, for example, JP 2015-074771 A can be used as long as the effect of the present embodiment is not impaired. One kind of the rubber-based tackifier may be contained, or two or more kinds of rubber-based tackifier may be contained. The rubber-based resin can contain any appropriate component as long as the effect of the present embodiment is not impaired. Examples of such a component include: resin components other than the rubber-based resin; tackifiers; inorganic fillers; organic fillers; metal powder; pigments; foils; softeners; anti-aging agents, conductive agents; ultraviolet absorbing agents; antioxidants, light stabilizers; surface lubricant agents; levelling agents; corrosion inhibitors; heat stabilizers, polymerization inhibitors; glidants; solvents; and catalysts.

[Silicone-Based Resin]

As the silicone-based resin, any appropriate silicone-based resin, such as a publicly known silicone-based tackifier as described in, for example, JP 2014-047280 A can be used as long as the effect of the present embodiment is not impaired. One kind of the silicone-based resin may be contained, or two or more kinds of silicone-based resins may be contained.

The silicone-based resin can contain any appropriate component as long as the effect of the present embodiment is not impaired. Examples of such a component include: resin components other than the silicone-based resin; tackifiers; inorganic fillers; organic fillers; metal powder; pigments; foils; softeners; anti-aging agents, conductive agents; ultraviolet absorbing agents; antioxidants, light stabilizers; surface lubricant agents; levelling agents; corrosion inhibitors; heat stabilizers, polymerization inhibitors; glidants; solvents; and catalysts. As the silicone-based resin, addition reaction-type silicone gel having an adhesive property may be used. The hardness of the silicone gel is greater than or equal to 15 and less than or equal to 45 in Asker C hardness of SKIS 0101 standard or is desirably greater than or equal to 20 and less than or equal to 200 in terms of the penetration (25° C.) compliant with JIS K2207 “petroleum asphalt”. As the addition reaction-type silicone gel, a silicon compound generally used as various kinds of conventionally available known silicone materials can be accordingly selected and used. Thus, thermal-curing or cold-curing silicone gel, condensation-type or addition-type silicone gel in terms of the curing mechanism, and the like can be used, and in particular, silicone gel obtained from an addition-type silicone composition is preferable. Moreover, a group bonding to a silicon atom is also not particularly limited, and examples of the group include: an alkyl group such as a methyl group, an ethyl group, and a propyl group; a cycloalkyl group such as a cyclopentyl group and a cyclohexyl group; an alkenyl group such as a vinyl group and an allyl group; an aryl group such as a phenyl group and a tolyl group; additionally include a group with at least one of hydrogen atoms of each of these groups being substituted with other atoms or other binding groups.

As a specific addition reaction-type silicone gel material, for example, product name: CF-5106 (penetration: 150) manufactured by Toray Dow Corning, Co., Ltd. is preferable. This silicone gel material includes a silicone resin which is a raw material including an A solution and a B solution. Both of the solutions are mixed with each other at a prescribed ratio and are heated, thereby obtaining a silicone gel material having a desired penetration. A production method of the addition reaction-type (or crosslinking) silicone gel used in the present embodiment is not particularly limited, but in general, the addition reaction-type (or crosslinking) silicone gel is preferably obtained by hydrosilylation reaction (addition reaction) of both organohydrogen polysiloxane and alkenyl polysiloxane described later which are raw materials in the presence of a catalyst. That is, the raw material substance of the silicone gel as mentioned in the present embodiment refers, in many cases, to organohydrogen polysiloxane and alkenyl polysiloxane. The organohydrogen polysiloxane used as one of the raw materials is preferably organohydrogen polysiloxane represented by general formula (1) below.

[Chemical Formula 1]

(1)

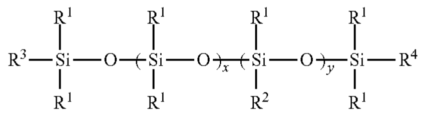

In the formula, $R^1$ represents a substituted or unsubstituted monovalent carbon hydride group, each $R^1$ is the same or different, $R^2$, $R^3$, and $R^4$ each represent $R^1$ or —H, at least two of $R^2$, $R^3$, and $R^4$ represent —H, and x and y are integers each representing the number of units, where the units are arranged in blocks or randomly and are preferably arranged randomly, x is an integer greater than or equal to 0 and is preferably from 15 to 40, and y is an integer greater than or equal to 0 and is preferably greater than or equal to 3 and less than or equal to 12. x+y is an integer greater than or equal to 18 and less than or equal to 300 and is preferably greater than or equal to 30 and less than or equal to 200. Moreover, a range of $y/(x+y)\leq 0.1$ is preferable, and when this range is exceeded, the number of crosslinking points increases, and thus, the shock absorbing layer of the present embodiment is not obtained.

Examples of $R^1$ include halogenated carbon hydride obtained by partially substituting, with a chlorine atom, a fluorine atom, or the like, an alkyl group such as a methyl group, an ethyl group, a propyl group, and a butyl group, a cycloalkyl group such as a cyclopentyl group and a cyclohexyl group, an aryl group such as a phenyl group and a tolyl group, an aralkyl group such as a benzyl group and a phenyl ethyl group, and a hydrogen atom thereof. Hydrogen directly bound to a silicon atom (Si—H) is required for addition reaction (hydrosilylation reaction) with an alkenyl group directly or indirectly bound to the silicon atom, and at least two hydrogen atoms are required in the organohydrogen polysiloxane molecule. A small number of hydrogen atoms directly bound to the silicon atoms is undesirable because in this case, the number of crosslinking points is too small to from silicone gel and no difference from the characteristics of silicone oil is made, whereas an excessively large number of hydrogen atoms directly bound to the silicon atom is not preferable because in this case, the number of crosslinking points is too large and no difference from the characteristics of silicone rubber is made.

Moreover, the alkenyl polysiloxane which is the other of the raw materials to be used to produce the crosslinking silicone gel according to the present embodiment is preferably represented by general formula (2) below.

[Chemical Formula 2]

(2)

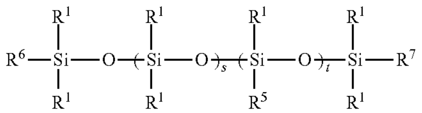

In the formula, $R^1$ represents a substituted or unsubstituted monovalent carbon hydride group, each $R^1$ is the same or different, $R^5$, $R^6$, and $R^7$ each represent $R^1$ or an alkenyl group, at least two of $R^5$, $R^6$, and $R^7$ represent alkenyl groups, and s and t are integers each representing the number of units, where the units are arranged in blocks or randomly and are preferably arranged randomly, s represents an integer greater than 0, t represents an integer greater than 0, s+t is an integer from 10 to 600, and $t/(s+t)\leq 0.1$ holds true. Moreover, a range of $t/(s+t)\leq 0.1$ is preferable, and when this range is exceeded, the number of crosslinking points increases, and thus, a transparent adhesive body for optical use of the present embodiment is not obtained.

Examples of $R^1$ include halogenated carbon hydride obtained by partially substituting, with a chlorine atom, a fluorine atom, or the like, an alkyl group such as a methyl group, an ethyl group, a propyl group, and a butyl group, a cycloalkyl group such as a cyclopentyl group and a cyclohexyl group, an aryl group such as a phenyl group and a tolyl group, an aralkyl group such as a benzyl group and a phenyl ethyl group, and a hydrogen atom thereof.

An alkenyl group (e.g., a vinyl group, an allyl group) directly or indirectly bound to a silicon atom is required for addition reaction (hydrosilylation reaction) with hydrogen directly bound to the silicon atom (Si—H), and at least two alkenyl groups are required in an alkenyl polysiloxane molecule. A small number of alkenyl groups is undesirable because in this case, the number of crosslinking points is too small to form silicone gel and no difference from the characteristics of silicone oil is made, whereas a too-large number of alkenyl groups is not preferable because in this case, the number of crosslinking points is too large and no difference from the characteristics of silicone rubber is made. Hydrogen polysiloxane represented by general formula (1) has —H (a hydrogen group) directly bound to a silicon atom, and alkenyl polysiloxane represented by general formula (2) has a carbon-carbon double bond, and therefore, the carbon-carbon double bond and the —H (the hydrogen group) cause addition reaction, which is referred to as hydrosilylation reaction. In the hydrogen polysiloxane represented by general formula (1), adjusting the equivalent ratio of the —H (the hydrogen group) directly bound to the silicon atom to an alkenyl group of the alkenyl polysiloxane represented by general formula (2) enables the hardness and buffering performance of the silicone composition to be adjusted.

The hydrosilylation reaction can be performed by a publicly known technique. That is, the reaction is performed in an alcohol (e.g., ethanol, isopropyl alcohol)-based organic solvent, an aromatic carbon hydride (e.g., toluene, xylene)-based organic solvent, an ether (e.g., dioxane, THF)-based organic solvent, an aliphatic carbon hydride-based organic solvent, a chlorinated carbon hydride-based organic solvent, or without a solvent. Moreover, the reaction temperature is usually higher than or equal to 50° C. and lower than or equal to 150° C., and the reaction can be caused by using a catalyst such as chloroplatinic acid, a complex obtained from chloroplatinic acid and alcohol, a platinum-olefin complex, a platinum-vinylsiloxane complex, or a platinum-phosphorus complex. As the usage amount of the catalyst, the amount of platinum atoms in the catalyst with respect to the alkenyl polysiloxane is usually greater than or equal to 1 ppm and less than or equal to 500 ppm, preferably greater than or equal to 3 ppm and less than or equal to 250 ppm in consideration of the physical properties of a curable and cured product.

The silicone gel has an adhesive property resulting from a non-crosslinking functional group of a surface of the silicone gel. For example, a silicone gel to which the publicly known adhesive property imparting method is applied may be used. The publicly known adhesive property imparting method includes, for example, blending a MQ resin-type tackifying component into a silicone gel, adding an unreactive adhesive component, and adjusting the length of a side chain of a non-crosslinking functional group, the type of a terminal functional group, and the like to cause the adhesive property to be exhibited.

(Pigment)

The pigment 3 is contained in the adhesive agent composition mainly in order to impart a light shielding property to each of the shock absorbing layers 10 to 13. That is, each of the shock absorbing layers 10 to 13 is provided with the desired light shielding property by the pigment 3.

The pigment 3 has an electrically insulating property. In the present disclosure, the electrically insulating property refers to the property that hardly conducts electricity due to a large electric resistance value. The resistivity (volume resistivity) of the pigment 3 is preferably within the range from $1\times10^{5}$ Ω·cm to $1\times10^{19}$ Ω·cm inclusive, and thereby, the electrically insulating property of each of the shock absorbing layers 10 to 13 is easily obtained. The resistivity of the pigment 3 is more preferably within the range from $1\times10^{11}$ Ω·cm to $1\times10^{19}$ Ω·cm inclusive, much more preferably within the range from $1\times10^{15}$ Ω·cm to $1\times10^{19}$ Ω·cm inclusive.

The resistivity of the pigment 3 is measured based on based on a four-terminal, four-pin method by, for example, Loresta-GP (model: UV-3101PC), which is a low resistivity meter, manufactured by Mitsubishi Chemical Corporation. The four-terminal four-pin method is a method in which four needle-like electrodes are arranged at prescribed intervals on a straight line on the surface of a sample (a green pellet), a prescribed current is caused to flow between two outside needle-like electrodes, and a potential difference resulting between two inside needle-like electrodes is measured, thereby obtaining volume resistivity.

The pigment 3 includes an inorganic material. In the present disclosure, examples of the inorganic material include insulating oxide, nitride, ceramic, and the like. Specifically, usable as the pigment 3 is oxide or nitride containing at least one kind of element selected from titanium, iron, zinc, titanium oxide, titanium nitride, and alumina. The pigment 3 including the inorganic material is less likely to be decolorized and has a stable property, and thus, the light shielding property of each of the shock absorbing layers 10 to 13 is less likely to be impaired.

The pigment 3 is preferably black. In the present disclosure, black is preferably within a range of $0\leq L^*\leq 14$, $6\leq a^*\leq 8$, $-10\leq b^*\leq -5$ in a coordinate based on the CIE 1976 ($L^*a^*b^*$) color space (measuring light source C: color temperature 6774K). In the most preferable embodiment, $L^*$ is 1.26, $a^*$ is 6.9, and $b^*$ is −8.12. The pigment 3 is, for example, jet black whose color code is #0d0015. When the pigment 3 is black, the desired light shielding property of each of the shock absorbing layers 10 to 13 is obtained.

The pigment 3 is in the form of particles. The particles of the pigment 3 are substantially spherical but may have various shapes. The average primary particle size of the pigment 3 is preferably within the range from 10 nm to 300 nm inclusive. Thus, particles of the pigment 3 are easily uniformly dispersed in the adhesive agent composition 2. Here, “uniform” means that the compositions included in the shock absorbing layers 10 to 13 are substantially the same per unit volume. The average primary particle size of the pigment 3 is more preferably within the range from 10 nm to 150 nm inclusive, much more preferably within the range from 10 nm to 100 nm inclusive.

Note that in the present disclosure, the average primary particle size is specified by the following method. Particles of a pigment included in an adhesive agent composition are observed by using a transmission electron microscope (TEM), a scanning transmission electron microscope (STEM), or a scanning electron microscope (SEM) at a magnification of 5000 or more. In an image obtained by the TEM or the STEM or particles observed with the SEM, particles of the pigment which do not form an aggregate are regarded as primary particles. The long diameter of the primary particle is regarded as a primary particle size. The primary particle sizes of 100 primary particles are measured. A result of calculation of an arithmetic mean value based on the number of primary particle sizes is defined as the average primary particle size.

The content of the pigment 3 each of in the shock absorbing layers 10 to 13 with respect to 100 parts by mass of the adhesive agent composition 2 is within the range from 2.5 parts by mass to 80 parts by mass inclusive. When the content of the pigment 3 is within this range, the light shielding property of the shock absorbing layers 10 to 13 is easily obtained without impairing the stress relieving property and the adhesive property of the adhesive agent composition 2. The content of the pigment 3 with respect to 100 parts by mass of the adhesive agent composition 2 is more preferably greater than or equal to 5 parts by mass and less than or equal to 40 parts by mass, much more preferably within the range from 10 parts by mass to 35 parts by mass inclusive.

Moreover, the pigment 3 is preferably surface treated with a silicone-based treatment agent in order to improve dispersibility into the adhesive agent composition 2.

The pigment 3 is preferably titanic acid nitride (titanium oxynitride). The titanic acid nitride has a large content of nitrogen and has a composition in general formula $TiO_xN_y$, where x is greater than or equal to 0.05 and less than or equal to 0.50, y is greater than or equal to 0.6 and less than or equal to 1.0. When the amount x of oxygen is less than 0.05, the insulating property is more likely to be unsatisfactory, whereas when the amount x of oxygen is greater than 0.50, the light shielding property is more likely to be impaired, and thus, such amount is not preferable. When the amount y of nitrogen is less than 0.60, the light shielding property is more likely to be impaired, whereas when the amount y of nitrogen is greater than 1.0, the insulating property is more likely to be unsatisfactory, and thus such amount is not preferable. The pigment 3 can impart the light shielding property to each of the shock absorbing layers (11, 12, and 13), and thus, another layer for shielding light no longer has to be provided in addition to the shock absorbing layers (11, 12, and 13), and therefore, this provides the advantage that the thickness of each of the shock absorbing laminates 100 and 101 of the present invention can be reduced.

(Liquid Enclosing Capsule)

The liquid enclosing capsules 4 mainly impart stress relaxation and thermal relaxation functions to the shock absorbing layers 10 to 13. Each liquid enclosing capsule 4 is formed by enclosing liquid in a shell (an outer shell). The shell contains a rubber elasticity resin. That is, the shell is elastic and thus, heating the shell or applying stress to the shell enables the particle size and the shape of the shell to vary. The liquid has a melting point of lower than or equal to −60° C. and a boiling point of higher than or equal to 180° C. That is, the liquid is less likely to cause phase transition to a solid substance or gas at an ordinary temperature under an atmospheric pressure.

Each liquid enclosing capsule 4 has the physical property that aerification expansion of the liquid therein is caused in the shell due to pressure or heat and the liquid returns to its original state when the pressure or heat thus applied is removed. Thus, when pressure or heat is applied to each of the shock absorbing layers 10 to 13, the pressure or heat is transmitted via the adhesive agent composition 2 to the liquid enclosing capsules 4, and aerification expansion of the liquid in each liquid enclosing capsule 4 is caused in the shell. Thus, the pressure or heat is absorbed by each of the shock absorbing layers 10 to 13 and is reduced from being transmitted outside. That is, each of the shock absorbing layers 10 to 13 absorb the shock of the pressure or heat.

The shell of each liquid enclosing capsule 4 is, in a specific example, made of a synthetic resin to have a hollow spherical shape, and the liquid is formed of a carbon hydride-based foaming agent. Examples of the liquid enclosing capsule 4 include a true-circular thermally expandable microscopic sphere in which a carbon hydride-based (isobutane) foaming agent is encapsulated, which has a shell formed of a methyl methacrylate-acrylonitrile copolymer, and which has a weight average particle diameter of about 15 μm, an absolute specific gravity of about 1.1, an expansion start temperature of higher than or equal to 90° C. and lower than or equal to 115° C., and a maximum expansion temperature of about 140° C. Moreover, examples of the liquid enclosing capsule 4 include a true-circular thermally expandable microscopic sphere in which a carbon hydride-based (isopentane) foaming agent (expansion agent) is encapsulated, which has a shell formed of a methyl methacrylate-acrylonitrile-methacrylonitrile copolymer, and which has a weight average particle diameter of greater than or equal to about 10 μm and less than or equal to 40 an absolute specific gravity of about 1.2, an expansion start temperature of about 120° C., and a maximum expansion temperature of about 190° C. An example of the liquid enclosing capsule 4 is "Expancel (registered trademark) 551DE40d42" (average particle size: 30 μm to 50 μm, density: 42 kg/$m^3$), which is a microscopic hollow body made of a copolymer of vinylidene chloride and acrylonitrile, manufactured by Japan Fillite Co., ltd.

(Heat Dissipation Fine Particle)

The heat dissipation fine particles 5 are contained mainly to impart the heat dissipation characteristics to each of the shock absorbing layers 10 to 13, and as the heat dissipation fine particles 5, an inorganic material such as aluminum hydroxide, magnesium oxide, anhydrous magnesium carbonate, alumina, silica, aluminum nitride, and boron nitride may be used. Note that the heat dissipation characteristics can be evaluated by measuring the thermal conductivity of each of the shock absorbing layers 10 to 13.

Adding heat dissipation fine particles changes the hardness and the viscoelastic characteristic of each of the shock absorbing layers 10 to 13. Thus, the particle size and the content of the heat dissipation fine particles 5 is at least accordingly set within the range providing a desired light shielding property and a shock-absorbing property of each of the shock absorbing layers 10 to 13. The heat dissipation characteristics of the shock absorbing layers 10 to 13 can be evaluated by measuring the respective thermal conductivities of the shock absorbing layers 10 to 13.

(Production Method of Shock Absorbing Layer)

The shock absorbing layers 10 to 13 of the present embodiment can be produced by any appropriate production method. The shock absorbing layers 10 to 13 are produced by preparing the adhesive agent composition 2 suitable to respective objects, molding the adhesive agent composition 2 by a molding method such as an extrusion molding method, and then drying and curing the adhesive agent composition 2. The shock absorbing layer 11 is produced by mixing and kneading the adhesive agent composition 2 and the pigment 3 with each other, molding the adhesive agent composition 2 by a molding method such as an extrusion molding method, and then drying and curing the adhesive agent composition 2. The shock absorbing layer 12 is produced by mixing and kneading the adhesive agent composition 2, the pigment 3, and the heat dissipation fine particles 5 with one another other, molding the adhesive agent composition 2 by a molding method such as an extrusion molding method, and then drying and curing the adhesive agent composition 2. The shock absorbing layer 13 is produced by mixing and kneading the adhesive agent composition 2, the pigment 3, the liquid enclosing capsules 4, and the heat dissipation fine particles 5 with one another other, molding the adhesive agent composition 2 by a molding method such as an extrusion molding method, and then drying and curing the adhesive agent composition 2.

Moreover, for example, a method may be used which includes: applying an adhesive agent composition, which is a material to be contained in the shock absorbing layers 10 to 13, onto a release liner which has been subjected to a peeling process; and then affixing the release liner to a heat diffusion layer. Examples of the method for performing the applying in this case include roll coating, gravure coating, reverse coating, roll brush, spray coating, air knife coating method, and extrusion coating with a die coater and the like. Moreover, the adhesive agent composition may be diluted with an appropriate solvent.

(Physical Property of Shock Absorbing Layer)

Figure 5:
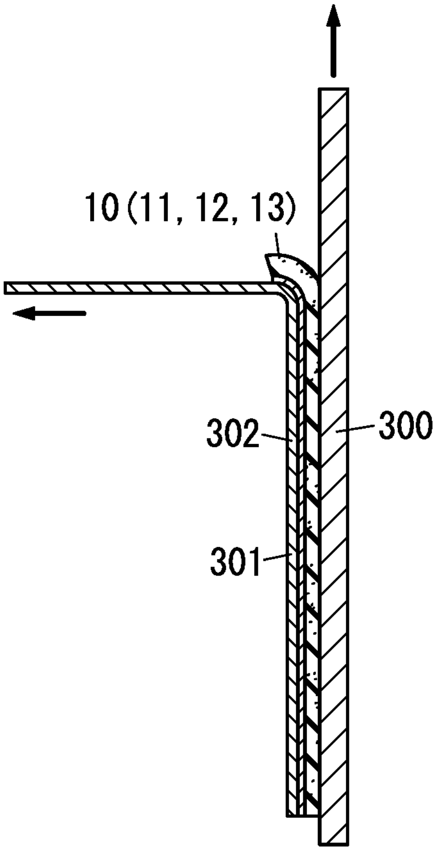
FIG. 5 is a view schematically illustrating a test for measuring adhesive force of the shock absorbing layer of the embodiment of the present disclosure.

The adhesive force of each of the shock absorbing layers 10 to 13 to a glass pane is greater than or equal to 1 N/20 mm. The adhesive force is measured as described below. The peel strength of 90-degree peeling in an adhesive force test compliant with JIS Z0237 "Testing methods of pressure-sensitive adhesive tapes and sheets" is defined as the adhesive force, and the adhesive force of the shock absorbing layer to the glass pane was measured with a 90-degree peeling tester at a speed of a tension rate of 300 mm/min. A test sample for evaluation of the adhesive force was produced, as schematically illustrated in FIG. 5, by affixing a glass pane 300 to one surface of each of the shock absorbing layers 10 to 13, and then, affixing a resin film (EMBLET, PET manufactured by UNITIKA LTD.) 301 to the other surface (back surface) via a primer (Primer A manufactured by Shin-Etsu Chemical Co., Ltd.) 302. The affixing condition is that a 2-kg roller is moved back and force once on the resin film, and each of the shock absorbing layers 10 to 13 is then left to stand for 24 hours at 23° C. Moreover, the glass pane 300 is a glass pane (manufactured by Hiraoka Special Glass Mfg. Co., Ltd.) made of soda glass and having a thickness of 1 mm.

The adhesive force of each of the shock absorbing layers 10 to 13 to the glass pane is greater than or equal to 1 N/20 mm Therefore, each of the shock absorbing layers 10 to 13 is easily affixed to and bonded to a glass pane included in a display panel of a liquid crystal panel, an organic EL panel, or the like so as not to easily fall off from the glass pane. Moreover, from the viewpoint of workability, such as re-affixing (rework) and the like of each of the shock absorbing layers 10 to 13 to the display panel, the adhesive force of each of the shock absorbing layers 10 to 13 to the glass pane is preferably greater than or equal to 1 N/20 mm and less than or equal to 10 N/20 mm, more preferably greater than or equal to 2 N/20 mm and less than or equal to 25 N/20 mm The shock absorbing layers 10 to 13 each have a transmittance of less than or equal to 0.1% for light having a wavelength of greater than or equal to 300 nm and less than or equal to 850 nm. The transmittance is compliant with JIS K 7136 and is measured with, for example, a spectrophotometer. Examples of the spectrophotometer include a spectrophotometer U-4100 (manufactured by Hitachi High-Technologies Corporation).

The light transmittance of each of the shock absorbing layers 10 to 13 is preferably low, and the lower limit thereof is thus 0%.

The shock absorbing layers 10 to 13 each have a penetration of greater than or equal to 30 and less than or equal to 120 at 25° C. in compliant with JIS K 2207. When the penetration of each of the shock absorbing layers 10 to 13 is less than 30, the shock absorbing layers 10 to 13 are too hard to be bent or stretched and are thus not flexibly deformed. When the penetration of each of the shock absorbing layers 10 to 13 is greater than 120, the shock absorbing layers 10 to 13 are too soft, resulting in impaired handleability, for example, increased difficulty in affixing of each of the shock absorbing layers 10 to 13 to another members. The penetration of each of the shock absorbing layers 10 to 13 under the conditions described above is more preferably within the range from 35 to 120 inclusive, much more preferably within the range from 50 to 110 inclusive.

The shock absorbing layers 10 to 13 each have a shock absorptance of greater than or equal to 20%. The shock absorptance is measured as described below. Impact acceleration was measured with pendulum shock tester PST-300 manufactured by SHINYEI TESTING MACHINERY CO., LTD. in compliant with HS C 60068-2-27, and then, the shock absorptance was measured based on the following formula.

Shock absorptance (%)=((1−impact acceleration in the case of the presence of a shock absorbing layer)/(impact acceleration in the case of the absence of a shock absorbing layer))×100

A test specimen for measurement of the impact acceleration was produced by affixing any of the shock absorbing layers 10 to 13 onto a polycarbonate board (PC boards) having a thickness t of 1.0 mm, and further affixing a metal circular cylinder having a Φ20 mm (=diameter of 20 mm) and a thickness t of 4 mm on the shock absorbing layer.

The shock absorptance of each of the shock absorbing layers 10 to 13 is preferably high, and the upper limit is thus 100%, but the upper limit of the shock absorptance of each of the shock absorbing layers 10 to 13 currently available is 85% and at least 80%.

The thickness of each of the shock absorbing layers 10 to 13 is preferably greater than or equal to 40 μm and less than or equal to 450 μm. The thickness of each of the shock absorbing layers 10 to 13 is more preferably greater than or equal to 100 μm and less than or equal to 400 μm.

Each of the shock absorbing layers 10 to 13 is preferably used, for example, for light shielding and shock absorption of the display panel. Thus, the display panel is easily protected by each of the shock absorbing layers 10 to 13 from a shock. Moreover, display by the display panel is more likely to be made clear by shielding light by each of the shock absorbing layers 10 to 13. The display panel is a liquid crystal panel, an organic EL panel, or the like.

Each of the shock absorbing layers 10 to 13 preferably includes a single layer. That is, each of the shock absorbing layers 10 to 13 preferably has an adhesive property, a light shielding property, and shock absorbency as a single layer without being laminated with another layer. Thus, each of the shock absorbing layers 10 to 13 is easily formed to be thin. The adhesive property means a property of adhering to another member. The adhesive property of each of the shock absorbing layers 10 to 13 is defined by adhesive force to glass panes. Moreover, the light shielding property means a property of shielding light. Each of the shock absorbing layers 10 to 13 is defined by a transmittance for light having a wavelength of greater than or equal to 300 nm and less than or equal to 850 nm. The shock absorbency means a function of absorbing a shock. The shock absorbency of each of the shock absorbing layers 10 to 13 is defined by shock absorptance.

Each of the shock absorbing layers 10 to 13 is arranged on the surface of the display panel and is used in this state. That is, each of the shock absorbing layers 10 to 13 is used by being laminated on a surface of a display panel, such as a liquid crystal panel, used in, for example, a flat panel display. Each of the shock absorbing layers 10 to 13, after being arranged on the surface of the display panel, does not require post-curing by heat and ultraviolet rays. As used herein, the post-curing means a curing step in a final stage of the production process. Thus, each of the shock absorbing layers 10 to 13, in a state of being arranged on the surface of the display panel, does not require a final curing step by heat and ultraviolet rays. That is, each of the shock absorbing layers 10 to 13 can be bonded to the surface of the display panel without the post-curing being performed by heat and ultraviolet rays. Thus, each of the shock absorbing layers 10 to 13 can be bonded without the display panel being adversely influenced by heat and ultraviolet rays.

Each of the shock absorbing layers 10 to 13 can be stored at an ordinary temperature. That is, each of the shock absorbing layers 10 to 13 can be stored without requiring a low temperature while the quality thereof is substantially unchanged for a long time period. As used herein, the ordinary temperature means 25° C. Moreover, each of the shock absorbing layers 10 to 13 can be stored for six months at the ordinary temperature while the adhesive property, light shielding property, penetration, and shock absorbency thereof are substantially unchanged.

[Heat Diffusion Layer]

The heat diffusion layer 20 is mainly provided to improve the thermal diffusive property of each of the shock absorbing laminates 100 and 101. That is, the shock absorbing laminates 100 and 101 are improved in the thermal diffusive property by the respective heat diffusion layers 20 and thus easily dissipate heat.

The heat diffusion layer 20 is made of a material having high thermal conductivity and contains, for example, graphite. The graphite includes stacked sheets of graphene (a black lead structure) in the form of plate-like crystals including carbon atoms bonded in the form of a hexagon. Thus, the heat diffusion layer 20 conducts heat more easily in the surface direction (XY direction) than in the thickness direction, and heat is easily diffused along the surface direction. The heat diffusion layer 20 is formed by bringing a sheet material including graphite into contact with and affixing it to a surface of the shock absorbing layer 10. That is, no adhesive layer is separately required to dispose the respective heat diffusion layers 20 on the surface of the shock absorbing layers 10 to 13. Thus, heat is easily conducted from each of the shock absorbing layers 10 to 13, and thereby, the heat dissipation characteristics of the shock absorbing laminates 100 and 101 are improved, and the thickness of each of the shock absorbing laminates 100 and 101 is less likely to be increased and can be reduced.

Moreover, the heat diffusion layer 20 may include a carbon fiber sheet. The carbon fiber sheet is a sheet including carbon fibers. That is, the carbon fiber sheet may be a sheet consisting of carbon fibers or a composition sheet including carbon fibers and other materials (e.g., a resin or fibers other than carbon fibers).

The carbon fiber sheet varies in thickness, shape, quality, and the like depending on formation methods. The carbon fiber sheet may be produced by a formation method without impregnation of a resin, and in this case, the carbon fiber sheet can be produced by, for example, a formation method of plain weaving, twill weaving, or screen weaving of carbon fibers. Alternatively, the carbon fiber sheet may be produced by a formation method of impregnating with a resin, and in this case, the carbon fiber sheet can be produced as, for example, a UD tape or prepreg.

Specifically, for example, carbon fiber sheets of item numbers as indicated below are available. Plain-woven carbon fiber sheet: manufactured by CAST, item number CF/03MP/1MCarbon fiber UD sheet: manufactured by CAST, item number CF/UD/W320/10MScreen carbon fiber sheet: manufactured by CAST, item number CF/15KUD200G/1M When the carbon fiber sheet is used as the heat diffusion layer 20, each of the shock absorbing laminates 100 and 101 according to the present embodiment is easily foldable. That is, using the carbon fiber sheet as the heat diffusion layer 20 makes easily foldable each of the shock absorbing laminates 100 and 101 according to the present embodiment. Thus, each of the shock absorbing laminates 100 and 101 according to the present embodiment is applicable to, for example, a foldable display panel.

When the carbon fiber sheet is used as the heat diffusion layer 20, each of the shock absorbing laminates 100 and 101 is easily folded for the following reasons.

When the shock absorbing laminate is folded, bend stress is applied to each layer. For example, when a graphite sheet is used as the heat diffusion layer 20, binding force between graphite crystals in a graphite sheet is less than the bend stress, resulting in poor appearances, such as fracture, bends, and creases, due to interlaminar fracture in the shock absorbing laminate. In contrast, in the case of the carbon fiber sheet used as the heat diffusion layer 20, flexible carbon fibers with high mechanical strength are arranged in a flat cloth shape and are knitted or woven, and therefore, the carbon fiber sheet can sustain the bend stress, and bends and/or creases can be suppressed from being formed, and thus, the shock absorbing laminate is easily foldable.

Note that in the present disclosure, "foldable" means that even when the shock absorbing laminates 100 and 101 are bent at 180°, the shock absorbing laminates 100 and 101 are not damaged and the performance of each of the shock absorbing laminates 100 and 101 is not impaired.

The thermal conductivity of the heat diffusion layer 20 is preferably within the range from 200 W/(m·K) to 3000 W/(m·K) inclusive. When the thermal conductivity of the heat diffusion layer 20 is within this range, desired heat dissipation characteristics of each of the shock absorbing laminates 100 and 101 are easily obtained. The thermal conductivity of the heat diffusion layer 20 is more preferably within the range from 500 W/(m·K) to 3000 W/(m·K) inclusive.

The thickness of the heat diffusion layer 20 is preferably within the range from 1 μm to 100 μm inclusive, more preferably within the range from 2 μm to 50 μm inclusive, and much more preferably within the range from 5 μm to 40 μm inclusive. When the thickness of the heat diffusion layer 20 is within this range, a desired heat dissipation characteristic of each of the shock absorbing laminates 100 and 101 is easily obtained, and the flex resistance and the reduced thickness are less likely to be impaired.

[Shield Layer]

The shield layer 40 is mainly provided to improve the electromagnetic interference shielding characteristic of each of the shock absorbing laminates 100 and 101. That is, each of the shock absorbing laminates 100 and 101 is improved in electromagnetic interference shielding characteristic by the shield layer 40 and easily performs shielding.

The shield layer 40 uses reflection loss, absorption loss, and the like to make difficult passage of an electromagnetic wave radiated from the outside of each of the shock absorbing laminates 100 and 101 through the shield layer 40 such that the electromagnetic wave hardly reaches another member (e.g., a display panel). Thus, the shield layer 40 preferably includes metal which is satisfactorily electrically conductive and is made of, for example, copper, aluminum, nickel, iron, gold, silver, or an alloy thereof.

The shield layer 40 may be formed of, for example, a metal foil or a metal mesh bonded via the bonding layer 30 to the surface of the heat diffusion layer 20. Moreover, the shield layer 40 may be formed by, for example, metal plating, vapor deposition, sputtering, electrically conductive coating, or the like, and in this case, the shield layer 40 may be directly formed on the surface of the heat diffusion layer 20 without providing the bonding layer 30. In the case of not providing the bonding layer 30, the thickness of each of the shock absorbing laminates 100 and 101 can further be reduced.

The shield layer 40 preferably includes a metal foil obtained by an electrolytic process or a rolling process. In the case of the metal foil being a copper foil, "CF series manufactured by Fukuda Metal Foil & Powder Co., Ltd." which is an electrolytic coper foil, "TPC series, HA-V2 series manufactured by JX Nippon Mining & Metals Corporation" which is a rolled copper foil, or the like may be used.

Moreover, the shield layer 40 may include electrically conductive cloth. The electrically conductive cloth is formed by subjecting polyester woven cloth or polyester unwoven cloth to metal plating. The electrically conductive cloth may be used together with, for example, a metal mesh. As electrically conductive unwoven cloth which is an example of the electrically conductive cloth, "item number Si-80-301 manufactured by SEIREN CO., LTD." May be used. Moreover, as electrically conductive woven cloth which is an example of the electrically conductive cloth, "item number Si-80-301 manufactured by SEIREN CO., LTD." may be used.

The shield performance of the shield layer 40 is within the range from 1 MHz to 1 GHz inclusive and is preferably within the range from 40 dB to 110 dB inclusive. When the shield performance of the shield layer 40 is within this range, the desired electromagnetic interference shielding characteristics of the shock absorbing laminates 100 and 101 are easily obtained. The shield performance of the shield layer 40 is preferably within the range from 1 MHz to 1 GHz inclusive and within the range from 40 dB to 110 dB inclusive, more preferably within the range from 1 GHz to 10 GHz inclusive and within the range from 80 dB to 110 dB inclusive.

The thickness of the shield layer 40 is preferably within the range from 0.5 μm to 50 μm inclusive. When the thickness of the shield layer 40 is within this range, a desired electromagnetic interference shielding characteristic of each of the shock absorbing laminates 100 and 101 is easily obtained, and the flex resistance and the reduced thickness are less likely to be impaired. The thickness of the shield layer 40 is more preferably within the range from 0.5 μm to 35 μm inclusive, much more preferably within the range from 0.5 μm to 5 μm inclusive.

[Bonding Layer]

The bonding layer 30 has a function of bonding the shield layer 40 to the heat diffusion layer 20. That is, the shield layer 40 is bonded via the bonding layer 30 to the surface of the heat diffusion layer 20.

The bonding layer 30 preferably has high thermal conductivity and low elasticity. When the bonding layer 30 has high thermal conductivity, heat is easily conducted from the heat diffusion layer 20 to the shield layer 40, which improves the heat dissipation characteristic of each of the shock absorbing laminates 100 and 101. Moreover, when the bonding layer 30 has low elasticity, the flex resistance of each of the shock absorbing laminates 100 and 101 is improved.

The thermal conductivity of the bonding layer 30 is preferably within the range from 200 W/(m·K) to 3000 W/(m·K) inclusive. When the thermal conductivity of the bonding layer 30 is within this range, a desired heat dissipation characteristic of each of the shock absorbing laminates 100 and 101 is easily obtained. The thermal conductivity of the bonding layer 30 is more preferably within the range from 500 W/(m·K) to 3000 W/(m·K) inclusive.

The elasticity of the bonding layer 30 preferably has a storage elastic modulus within the range from $10^3$ Pa to $10^5$ Pa inclusive between 25° C. and 100° C. inclusive and preferably has a tan δ within the range from $10^{-2}$ to 1 inclusive. When the storage elastic modulus of the bonding layer 30 is within this range, the desired flex resistance of each of the shock absorbing laminates 100 and 101 is easily obtained. The storage elastic modulus of the bonding layer 30 between 25° C. and 100° C. inclusive is more preferably within the range from $10^4$ to $10^5$ inclusive. The bonding layer 30 may include, for example, an epoxy-based bonding agent such as item number T7109-19 of EPO-TEK series (manufactured by Epoxy Technology, Inc.) or an acrylic bonding agent such as ThreeBond3955 (manufactured by ThreeBond Co., Ltd.)

Figure 3:
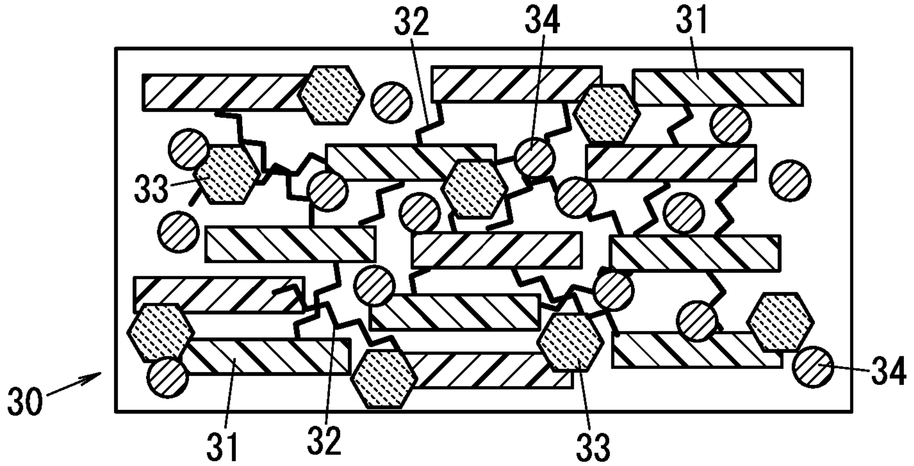
FIG. 3 is a view schematically illustrating a bonding layer of the shock absorbing laminate of the embodiment according to the present disclosure.

As illustrated in FIG. 3, the bonding layer 30 preferably includes an epoxy resin 31, a curing agent 32, graphene bonding structures 33, and heat dissipation fine particles 34.

As the epoxy resin 31, a resin having strong toughness to improve the crack resistance of the bonding layer 30 is preferable, and examples of the epoxy resin 31 are preferably as shown in Table 1 below.

TABLE 1

| No | Product No. | Manufacturer | State at Ordinary Temperature | Epoxy Equivalent |
|---|---|---|---|---|
| 1 | CEL2021P | Daicel Corporation | Liquid | 137 |

Structure

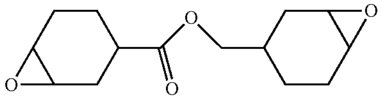 [SMILES: O=C(OCC1CCC2OC2C1)C1CCC2OC2C1]

TABLE 1-continued
| No | Product No. | Manufacturer | State at Ordinary Temperature | Epoxy Equivalent |
|---|---|---|---|---|
| 2 | CEL2081 | Daicel Corporation | Liquid | 200 |
| | | Structure 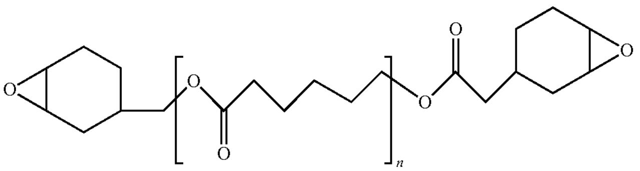 | | |
| 3 | EXA4850-150 | DIC | Liquid | 450 |
| | | Structure 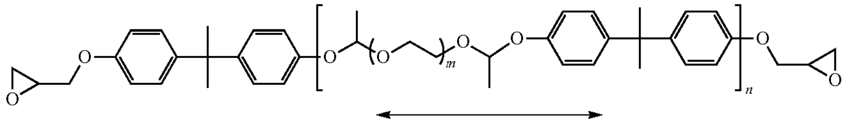 | | |
| 4 | EXA4850-1000 | DIC | Liquid | 350 |
| | | Structure 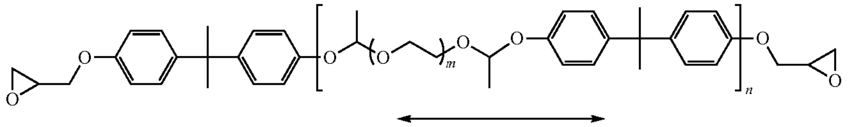 | | |
| 5 | EXA4816 | DIC | Liquid | 403 |
| | | Structure 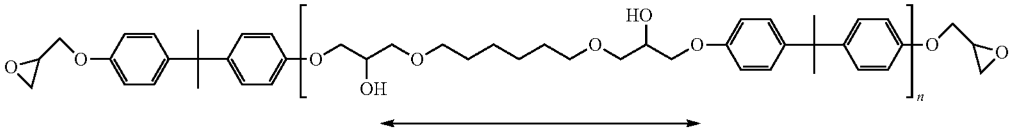 | | |
| 6 | JER871 | Mitsubishi Chemical Corporation | Liquid | 421 |
| | | Structure 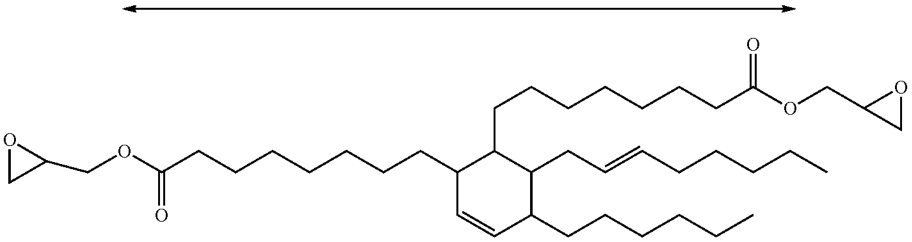 [SMILES: CCCCC/C=C/CC1C(CCCCCC)C=CC(CCCCCCCC(=O)OCC2CO2)C1CCCCCCCC(=O)OCC1CO1] | | |
| 7 | YX7400 (YL7410) | Mitsubishi Chemical Corporation | Liquid | 440 |
| | | Structure 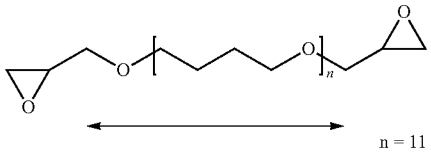 n = 11 | | |

TABLE 1-continued

| No | Product No. | Manufacturer | State at Ordinary Temperature | Epoxy Equivalent |
|---|---|---|---|---|
| 8 | YX7110B80 | Mitsubishi Chemical Corporation | Semisolid | 1124 |
| | | Structure | | |
| | | 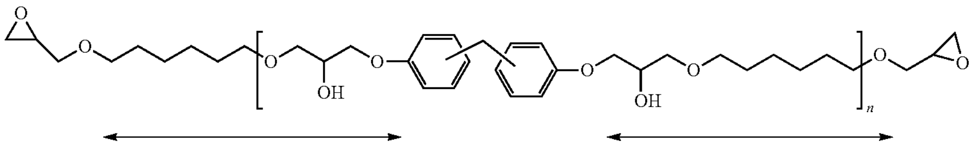 | | |

Moreover, as the epoxy resin 31, an epoxy resin having flexibility (low elasticity) is preferable. Thus, epoxy resins in Nos. 3 to 8 in Table 1 are preferably used. Using an epoxy resin having the flexibility improves the flex resistance of the bonding layer 30. The epoxy resin having flexibility is an epoxy resin having a tensile elongation percentage of preferably greater than or equal to 10% and less than or equal to 150%, more preferably greater than or equal to 15% and less than or equal to 150%, much more preferably greater than or equal to 20% and less than or equal to 180%, having a tensile elastic modulus of preferably less than 3000 MPa, more preferably less than 2800 MPa, much more preferably less than 2500 MPa, and/or having a flexural elastic modulus of preferably less than 2000 MPa, more preferably less than 1800 MPa, much more preferably less than 1500 MPa.

The flexibility of the epoxy resin varies depending on the number of atoms in the main chain of a flexibility structure part (a part indicated by the double-headed arrow in Table 1) and the number of stiffness structures (parts at which benzene rings are connected via carbon atoms) of the epoxy resin. Thus, the number of flexibility structure parts and the number of stiffness structures are adjusted to obtain desired performance such as tear strength.

Note that the flexibility structure part has a structure denoted by general formula (3) or (4) below.

[Chemical Formula 3]

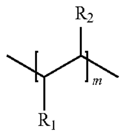

(3)

In the formula (3), $R_1$ and $R_2$ independently represent a hydrogen atom or an alkyl group, and m is an integer greater than or equal to 2 and less than or equal to 15.

[Chemical Formula 4]

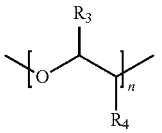

(4)

In the formula (4), $R^3$ and $R^4$ independently represent a hydrogen atom or an alkyl group, and n is an integer greater than or equal to 2 and less than or equal to 15.

The curing agent 32 causes reaction of the epoxy resin 31 to cure the epoxy resin 31. Specifically, various kinds of cation curing agents and anion curing agents may be used as the curing agent 32. The curing agent 32 preferably has flexibility in a similar manner to the epoxy resin 31. This improves the flex resistance of the bonding layer 30. As the curing agent having flexibility, for example, CPI-100P, CPI-101A, CPI-200K manufactured by San-Apro Ltd., SP-170 manufactured by ADEKA CORPORATION, and B2380, C1390, D2238, D2960, I0591, M1209, N0137, T1608 manufactured by Wako Pure Chemical Corporation may be used.

The graphene bonding structures 33 are included to improve an bonding property to graphene included in the heat diffusion layer 20. The graphene bonding structures 33 are molecules each having a structure similar to the structure of the graphene, and, for example, OGSOL PG-100, and OGSOL EG-200 manufactured by Osaka Gas Chemicals Co., Ltd. may be used.

The heat dissipation fine particles 34 are similar to the heat dissipation fine particles 5.

[Use of Shock Absorbing Laminate]

The shock absorbing laminates 100 and 101 according to the present embodiment are each used by being affixed to another member. In this case, the shock absorbing layers 10 to 13 each have an adhesive property. Thus, the surface of each of the shock absorbing layers 10 to 13 can be brought into contact with and can be affixed to a surface of another member. Note that when each of the shock absorbing laminates 100 and 101 is to be tightly affixed to another member, an bonding agent and/or an adhesive agent may be used together.

Figure 4:
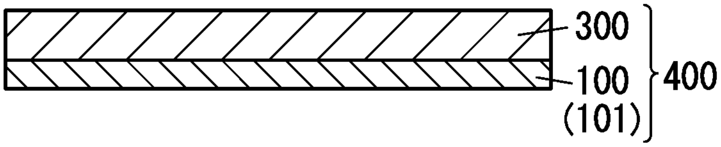
FIG. 4 is a view schematically illustrating a display device of an embodiment of the present disclosure.

Another member is a member easily damaged by a shock and is, for example, a display panel 300 such as a liquid crystal panel or an organic EL panel as illustrated in FIG. 4. In a display device 400 of the present disclosure, each of the shock absorbing laminates 100 and 101 is in contact with and is affixed to a back surface of the display panel 300 (a surface on an opposite side of a side on which characters and/or images are to be displayed, that is, a surface on a non-display side of the display panel 300). Examples of the display panel include a flexible organic liquid crystal display (OLCD), an electronic paper (E Paper), an organic EL display (OLED), a quantum dot display (QLED), and a micro-LED display (μLED).

The shock absorbing laminates 100 and 101 according to the present embodiment are thinner, have more flexibility to allow bending deflection than those formed by a known technique, are lighter in weight, and have functions of being bent and the like, and further have light shielding properties, heat dissipation characteristics, and electromagnetic interference shielding characteristics. Thus, affixing each of the shock absorbing laminates 100 or 101 to the display panel 300 such as a liquid crystal panel or an organic EL panel makes also possible to provide an optical display cell which realizes a large screen in use of the display panel 300 and which allows the display panel 300 to be folded to reduce its size, for example, while the display panel 300 is carried.

EXAMPLES

Example 1

A mixture was obtained by mixing: 40 parts by weight of polydiorganosiloxane (dimethyl polysiloxane which has both ends blocked with trimethylsiloxy groups, which has a molecular chain containing an alkenyl group bonded to a Si atom, and which has a molecular weight (MW) of about 660,000); 60 parts by weight of polyorganosiloxane (polysiloxane including $(CH_3)_3SiO_{1/2}$ unit (M unit) and $SiO_{4/2}$ unit (Q unit), having a molar ratio of M unit/Q unit is 0.75 at a molecular weight (MW) of about 8,000, and being in a rubber state at room temperature); 0.4 parts by weight of polyorganohydrogensiloxane (dimethyl hydrogen polysiloxane which has both terminals blocked with trimethylsiloxy groups, which has a molecular chain containing a hydrogen group bonded to a Si atom, and which has a molecular weight (MW) of about 1,600); 0.3 parts by weight of reaction inhibitor (1-ethinyl cyclohexanol); 0.15 parts by weight of curing catalyst (platinum-vinyl dimer complex (Pt: 2% wt)) required for addition reaction; and 1.0 parts by weight of isocyanurate derivative (isocyanuric acid tris [3-(trimethoxysilyl)propyl]), and the mixture was diluted with 51 parts by weight of toluene, thereby obtaining an application mixture. This application mixture includes a raw material of an adhesive agent composition, a pigment, and heat dissipation fine particles.

The application mixture was applied to a release-processed surface of a release film (product name “MRF #38”, manufactured by Mitsubishi Plastics, Inc.) to have a thickness of 100 μm after being cured, and then, a graphite sheet (manufactured by GUARDNEC Co., Ltd, item number: GD-25, thickness: 25 μm) which is a heat diffusion layer was affixed to the application mixture, and a resultant product was subjected to heat curing at 130° C. for 3 minutes, thereby obtaining an intermediate laminated body. A cured•dried product of the mixture in the intermediate laminated body serves as the shock absorbing layer, and the shock absorbing layer includes an adhesive agent composition (cured material). To the entirety of a surface of the graphite sheet of the intermediate laminated body, a liquid bonding agent (item number T7109-19 (EPO-TEK series (registered trademark) manufactured by Epoxy Technology, Inc.) was applied to have a thickness of 25 μm, a copper foil (electrolytic coper foil CF for electromagnetic wave shield manufactured by Fukuda Metal Foil & Powder Co., Ltd.) as a shield layer was affixed to the liquid bonding agent, and then a resultant product was left to stand for 24 hours or longer at room temperature, thereby obtaining a shock absorbing laminate (the total thickness of the shock absorbing laminate except for the copper foil: 150 μm).

The composition of Example 1 is shown in Table 2.

TABLE 2

| | | Parts by Weight |
|---|---|---|
| Adhesive Agent Composition | Polydiorganosiloxane | 40 |
| | Polyorganosiloxane | 60 |
| | Polyorganohydrogensiloxane | 0.4 |
| | Reaction Inhibitor | 0.3 |
| | Curing Catalyst | 0.15 |
| | Isocyanurate Derivative | 1 |
| Pigment | Insulating Black Pigment | — |
| Heat Dissipation Fine Particle | Fine Heat Dissipation Particle | — |

Example 2

Two-liquid addition reaction-type silicone gel (model: X32-3443) manufactured by Shin-Etsu Chemical Co., Ltd. was applied to a release-processed surface of a release film (product name “MRF #38”, manufactured by Mitsubishi Plastics, Inc.) to have a thickness of 100 μm after being cured, and then, a graphite sheet (manufactured by GUARDNEC Co., Ltd, item number: GD-25, thickness: 25 μm) which is a heat diffusion layer was affixed to the two-liquid addition reaction-type silicone gel, and a resultant product was subjected to heat curing at 130° C. for 3 minutes, thereby obtaining an intermediate laminated body. A cured•dried product of the two-liquid addition reaction-type silicone gel in the intermediate laminated body serves as the shock absorbing layer, and the shock absorbing layer includes an adhesive agent composition (a cured material of the two-liquid addition reaction-type silicone gel). To the entirety of a surface of the graphite sheet of the intermediate laminated body, a liquid bonding agent (item number T7109-19 of product number EPO-TEK (registered trademark) manufactured by Epoxy Technology, Inc.) was applied to have a thickness of 25 μm, a copper foil (electrolytic coper foil CF for electromagnetic wave shield manufactured by Fukuda Metal Foil & Powder Co., Ltd.) as an electromagnetic shielding layer was affixed to the liquid bonding agent, and then, a resultant product was left to stand for 24 hours or longer at room temperature, thereby obtaining a shock absorbing laminate (the total thickness of the shock absorbing laminate except for the copper foil: 150 μm).

Example 3

Into a four-neck flask, 60 parts by weight of dicyclopentanyl acrylate (DCPMA, dicyclopentanyl methacrylate), 40 parts by weight of methyl methacrylate (MMA, methacrylic acid methyl), 3.5 parts by weight of a chain transfer agent (α-thioglycerol), and 100 parts by weight of polymerization solvent (toluene) were put and were agitated in the nitrogen atmosphere at 70° C. for 1 hour. Then, 0.2 parts by weight of polymerization initiator (2,2'-azobisisobutyronitrile) was added and reaction thereof was caused at 70° C. for 2 hours, and subsequently at 80° C. for 2 hours, thereby obtaining the reaction solution. Thereafter, the reaction solution was put into a 130° C.-temperature atmosphere to dry and remove the toluene, the chain transfer agent, and unreacting monomers, thereby preparing a solid acrylic polymer. The target value of the weight average molecular weight (Mw) of the polymer is $5.1\times10^3$.

Next, 0.035 parts by weight of photopolymerization initiator A (product name “Irgacure 184”, manufactured by BASF) and 0.035 parts by weight of photopolymerization initiator B (product name “Irgacure 651”, manufactured by BASF) were blended into a monomer mixture obtained by mixing 68 parts by weight of acrylic acid 2-ethyl hexyl (2EHA), 14.5 parts by weight of N-vinyl-2-pyrrolidone (NVP), and 17.5 parts by weight of acrylic acid 2-hydroxy ethyl (HEA) and were then irradiated with ultraviolet rays to have a viscosity of 20±3 Pa·s (measurement condition: BH viscometer No. 5 rotor, 10 rpm, measurement temperature: 30° C.), thereby preparing a prepolymer composition in which the monomer component is partially polymerized.

A mixture was obtained by adding and mixing 5 parts by weight of the acrylic polymer, 0.15 parts by weight of hexanediol diacrylate (HDDA), and 0.3 parts by weight of silane coupling agent (product name "KBM-403", manufactured by Shin-Etsu Chemical Co., Ltd.) to and with 100 parts by weight of the prepolymer composition.

The mixture was applied to a release-processed surface of a release film (product name "MRF #38", manufactured by Mitsubishi Plastics, Inc.) to have a thickness of 100 μm after formation of the adhesive agent layer, and then, a graphite sheet (manufactured by GUARDNEC Co., Ltd, item number: GD-25, thickness 25 μm) which is a heat diffusion layer was affixed to the mixture. Thereafter, ultraviolet irradiation was performed under the condition that the illuminance is 5 $mW/cm^2$ and the quantity of light is 1500 $mJ/cm^2$ to cause photocuring of a resin, thereby obtaining an intermediate laminated body. A cured•dried product of the resin in the intermediate laminated body serves as the shock absorbing layer, and the shock absorbing layer includes an adhesive agent composition (a cured material of the resin). To the entirety of a surface of the graphite sheet of the intermediate laminated body, a liquid bonding agent (item number T7109-19 of product number EPO-TEK (registered trademark) manufactured by Epoxy Technology, Inc.) was applied to have a thickness of 25 μm, a copper foil (electrolytic coper foil CF for electromagnetic wave shield manufactured by Fukuda Metal Foil & Powder Co., Ltd.) as an electromagnetic shielding layer was affixed to the liquid bonding agent, and then a resultant product was left to stand for 24 hours or longer at room temperature, thereby obtaining a shock absorbing laminate (the total thickness of the shock absorbing laminate except for the copper foil: 150 μm).

The composition of Example 3 is shown in Table 3.

TABLE 3

| | | Parts by Weight |
|---|---|---|
| Acrylic Polymer A | Dicyclopentanyl Acrylate | 60 |
| | Methyl Methacrylate | 40 |
| | Chain Transfer Agent | 3.5 |
| | Polymerization Initiator | 0.2 |
| Prepolymer Composition | Acrylic acid 2-ethyl hexyl | 14.5 |
| | Acrylic acid 2-hydroxy ethyl | 17.5 |
| | Photopolymerization Initiator A | 0.035 |
| | Photopolymerization Initiator B | 0.035 |
| Adhesive Agent Composition | Prepolymer Composition | 100 |
| | Acrylic Polymer A | 5 |
| | Hexanediol Diacrylate | 0.15 |
| | Silane Coupling Agent | 0.3 |

Example 4

As base polymers of the shock absorbing layer, 86.5 parts by weight of polyol A (PREMINOL) S4011 (polypropylene glycol, number average molecular weight: 10,000, AGC Inc.)), 0.5 parts by weight of polyol B (EXCENOL 410NE (an alkoxide adduct of pentaerythritol, number average molecular weight: 550, AGC Inc.)), 8 parts by weight of monool (PREMINOL) S1004F (polyoxypropylene alkyl ether, number average molecular weight: 3,500, AGC Inc.)), 5 parts by weight of rosin diol (Pine Crystal D6011 (rosin-containing diol; Arakawa Chemical Industries, Ltd.)), and 20 parts by weight of tackifier (Benzel A75 (rosin ester-based resin; Arakawa Chemical Industries, Ltd.)) were mixed with each other and were melted by being heated at 80° C. for 0.5 hours, thereby obtaining a mixture. Then, to the mixture, 5.5 parts by weight of polyisocyanate (isophorone diisocyanate (IPDI)) were added and were caused to react at 90° C. for 3 hours, thereby obtaining a prepolymer. The prepolymer was cooled at room temperature for 24 hours or longer, and 3.5 parts by weight of fine powder coating amine as a curing agent were mixed with 100 parts by weight of the prepolymer thus obtained and were agitated, thereby obtaining a final mixture.

Note that the fine powder coating amine was produced as described below in accordance with JP 2000-117090 A. A mixture was obtained by mixing 76.9 parts by weight of 1,12-dodecane diamine (melting point 71° C.) having a central particle size of about 8 μm and 23. 1 parts by weight of superfine particle titanium oxide having a central particle size of about 0.02 μm with each other, and the mixture was subjected to a composite-forming process performed by a high-speed impact mixing agitator (manufactured by NISSHIN ENGINEERING INC., Hi-X mixer), thereby obtaining 100 parts by weight of fine powder coating amine which are superfine particles of titanium oxide having a central particle size of about 0.02 μm and being fixed to a surface of the 1,12-dodecane diamine having a central particle size of about 8 μm.

The final mixture was applied to a release-processed surface of a release film (product name "MRF #38", manufactured by Mitsubishi Plastics, Inc.) to have a thickness of 100 μm after formation of the adhesive agent layer, and then, a graphite sheet (manufactured by GUARDNEC Co., Ltd, item number: GD-25, thickness 25 μm) which is a heat diffusion layer was affixed to the final mixture. Thereafter, the final mixture was subjected to heat curing in 80° C.-atmosphere for 1 minute, thereby obtaining an intermediate laminated body. A cured•dried product of the final mixture in the intermediate laminated body serves as the shock absorbing layer, and the shock absorbing layer includes an adhesive agent composition (cured material of a prepolymer). To the entirety of a surface of the graphite sheet of the intermediate laminated body, a liquid bonding agent (item number T7109-19 of product number EPO-TEK (registered trademark) manufactured by Epoxy Technology, Inc.) was applied to have a thickness of 25 μm, a copper foil (electrolytic coper foil CF for electromagnetic wave shield manufactured by Fukuda Metal Foil & Powder Co., Ltd.) as an electromagnetic shielding layer was affixed to the liquid bonding agent, and then a resultant product was left to stand for 24 hours or longer at room temperature, thereby obtaining a shock absorbing laminate (the total thickness of the shock absorbing laminate except for the copper foil: 150 μm).

The composition of Example 4 is shown in Table 4.

TABLE 4

| | | Parts by Weight |
|---|---|---|
| Adhesive Agent Composition | Polyol A | 86.5 |
| | Polyol B | 0.5 |
| | Monool | 8 |

TABLE 4-continued

| | | Parts by Weight |
|---|---|---|
| | Rosin Diol | 5 |
| | Tackifier | 20 |
| | Polyisocyanate | 5.5 |
| | Curing Agent | 3.5 |

Example 5

A shock absorbing laminate (the total thickness of the shock absorbing laminate except for the copper foil: 150 μm) was obtained in a similar manner to Example 1 except that before application of the mixture of Example 1, 2.5 parts by weight of insulating black pigment (item number 13M-C manufactured by Mitsubishi Materials Corporation) were mixed with and dissipated in 100 parts by weight of the mixture. The transmittance (%) of light having a wavelength of greater than or equal to 300 nm and less than or equal to 850 nm was reduced to 0.1% or less. The pigment was included in the shock absorbing layer, which enables the light transmittance to be reduced.

The composition of Example 5 is shown in Table 5.

TABLE 5

| | | Parts by Weight |
|---|---|---|
| Adhesive Agent Composition | Polydiorganosiloxane | 40 |
| | Polyorganosiloxane | 60 |
| | Polyorganohydrogensiloxane | 0.4 |
| | Reaction Inhibitor | 0.3 |
| | Curing Catalyst | 0.15 |
| | Isocyanurate Derivative | 1 |
| Pigment | Insulating Black Pigment | 10 |
| Heat Dissipation Fine Particle | Fine Heat Dissipation Particle | — |

Example 6

The shock absorbing laminate (the total thickness of the shock absorbing laminate except for the copper foil: 150 μm) was obtained in a similar manner to Example 1 except that before application of the mixture of the first example, 2.5 parts by weight (item number 13M-C manufactured by Mitsubishi Materials Corporation) of insulating black pigment and 30 parts by weight of fine heat dissipation particle (silica filler, item number S0-C1 manufactured by Admatechs Company Limited) were mixed with and dissipated in 100 parts by weight of the mixture. The transmittance (%) of light having a wavelength of greater than or equal to 300 nm and less than or equal to 850 nm was reduced to 0.1% or less. The pigment was included in the shock absorbing layer, which enables the light transmittance to be reduced.

The composition of Example 6 is shown in Table 5.

TABLE 6

| | | Parts by Weight |
|---|---|---|
| Adhesive Agent Composition | Polydiorganosiloxane | 40 |
| | Polyorganosiloxane | 60 |
| | Polyorganohydrogensiloxane | 0.4 |
| | Reaction Inhibitor | 0.3 |
| | Curing Catalyst | 0.15 |
| | Isocyanurate Derivative | 1 |
| Pigment | Insulating Black Pigment | 10 |
| Heat Dissipation Fine Particle | Fine Heat Dissipation Particle | 30 |

Example 7

A shock absorbing laminate (the total thickness of the shock absorbing laminate except for the copper foil: 150 μm) was obtained in a similar manner to Example 2 except that 2.5 parts by weight (item number 13M-C manufactured by Mitsubishi Materials Corporation) of insulating black pigment and 30 parts by weight of fine heat dissipation particle (silica filler, item number S0-C1 manufactured by Admatechs Company Limited) were mixed with and dissipated in 100 parts by weight of two-liquid addition reaction-type silicone gel (model: X32-3443) manufactured by Shin-Etsu Chemical Co., Ltd. used in Example 2.

Example 8

A shock absorbing laminate was obtained in a similar manner to Example 1 except that as a shield layer, a rolled copper foil (HA-V2 12 μm manufactured by JX Nippon Mining & Metals Corporation) was used in place of the electrolytic coper foil.

Example 9

A shock absorbing laminate was obtained in a similar manner to Example 1 except that as a shield layer, electrically conductive woven cloth (item number Sui-10-30T manufactured by SEIREN CO., LTD.) was used in place of the electrolytic coper foil.

Example 10

A shock absorbing laminate was obtained in a similar manner to Example 1 except that an acrylic bonding agent (ThreeBond3955 manufactured by ThreeBond Co., Ltd.) was used in place of the epoxy-based liquid bonding agent.

Comparative Example 1

High impact absorbing foam having a thickness of 80 μm (product number ISR-TUF-RP manufactured by Iwatani Corporation) was affixed to a 25-μm-thickness transparent two-sided adhesive tape (product number CS9861 manufactured by Nitto Denko Corporation). Then, another 25-μm-thickness transparent two-sided adhesive tape was affixed to the high impact absorbing foam. Thereafter, a graphite sheet (manufactured by GUARDNEC Co., Ltd, item number: GD-25, thickness 25 μm) which is a heat diffusion layer was affixed to the another 25-μm-thickness transparent two-sided adhesive tape. Then, a liquid bonding agent (item number T7109-19 of product number EPO-TEK (registered trademark) manufactured by Epoxy Technology, Inc.) was applied to the entirety of the graphite sheet to have a thickness of 25 μm. A copper foil (electrolytic coper foil CF for electromagnetic wave shield manufactured by Fukuda Metal Foil & Powder Co., Ltd.) as an electromagnetic shielding layer was affixed to the liquid bonding agent. Then, a resultant product was left to stand for 24 hours or longer at room temperature, thereby obtaining a shock absorbing laminate (the total thickness of the shock absorbing laminate except for the copper foil: 180 μm).

Comparative Example 2

A rear surface of a light shielding base material of a light shielding polyester film adhesive tape (a tape obtained by affixing item number 6732#25: light shielding base material manufactured by TERAOKA SEISAKUSHO CO., LTD. to an adhesive layer in advance) having a total thickness of 55 μm was affixed to a 25-μm-thickness transparent two-sided adhesive tape (manufactured by Nitto Denko Corporation, item number CS9861). Then, high impact absorbing foam having a thickness of 80 μm (manufactured by Iwatani Corporation, item number ISR-TUF-RP) was affixed to the adhesive agent of the light shielding polyester film adhesive tape. Then, another 25-μm-thickness transparent two-sided adhesive tape was affixed to the high impact absorbing foam. Thereafter, a graphite sheet (manufactured by GUARDNEC Co., Ltd, item number GD-25 (25 μm)) which is a heat diffusion layer was affixed to the another 25-μm-thickness transparent two-sided adhesive tape. Thereafter, to the entirety of the graphite sheet, a liquid bonding agent (item number T7109-19 of product number EPO-TEK (registered trademark) manufactured by Epoxy Technology, Inc.) was applied to have a thickness of 25 μm. A copper foil (electrolytic coper foil CF for electromagnetic wave shield manufactured by Fukuda Metal Foil & Powder Co., Ltd.) as an electromagnetic shielding layer was affixed to the liquid bonding agent. Then, a resultant product was left to stand for 24 hours or longer at room temperature, thereby obtaining a shock absorbing laminate (the total thickness of the shock absorbing laminate except for the copper foil: 235 μm).

(Evaluation)

A drop shock test was conducted in compliant with MIL-STD-810G Method 516.6-Shock. A lamination layer material affixed to a back surface of an organic EL display mounted on Galaxy S2 manufactured by Samsung Electronics Co., Ltd. was peeled off, each of the shock absorbing laminates was then affixed to the back surface of the organic EL display, the organic EL display was reassembled to be a product, and then a test was conducted.

The flexural modulus was measured in compliant with JIS K 7171: 2016.

A tensionless flex test was conducted by using a stand-alone endurance test machine, TCD-BTFB, manufactured by Yuasa System Co., Ltd. Each shock absorbing laminate was cut in a 20-cm-square and was fixed such that a cored bar having a diameter of 20 mm corresponds to the center-line of the laminate thus cut, and rolling up and rolling out of the shock absorber were repeated at a speed of 30 times per minute to evaluate whether or not breakage and/or interlayer peeling is found.

TABLE 7

| Evaluation Item | | | Example 1 | Example 2 | Example 3 | Example 4 |
|---|---|---|---|---|---|---|
| Layer Constitution | Shock Absorbing Layer | Adhesive Agent Composition | Silicone-based | Silicone-based | Acrylic-based | Urethane-based |
| | | Pigment | None | None | None | None |
| | | Heat Dissipation Fine Particle | None | None | None | None |
| | Heat Diffusion Layer | | Graphite Sheet | Graphite Sheet | Graphite Sheet | Graphite Sheet |
| | Bonding Laver | | Epoxy-based | Epoxy-based | Epoxy-based | Epoxy-based |
| | Shield Layer | | Electrolytic Copper Foil | Electrolytic Copper Foil | Electrolytic Copper Foil | Electrolytic Copper Foil |
| Physical Property of Shock Absorbing Layer | | Bonding Force to Glass (N/20 mm) | 16 | 17 | 10 | 20 |
| | | Storage Elastic Modulus (Pa) | $2 \times 10^4$ | $1 \times 10^4$ | $1 \times 10^5$ | $8 \times 10^4$ |
| | | tanδ | 0.6 | 0.5 | 0.1 | 0.3 |
| | | Shock Absorptance (%) | 25 | 23 | 20 | 21 |
| | | Thermal Conductivity (W/m · K) | 0.1 | 0.1 | 0.1 | 0.1 |
| | | Transmittance (%) | 91 | 91 | 90 | 90 |
| Flexural Modulus (GPa) | | | 1.7 | 1.2 | 1.4 | 2.4 |
| Drop Shock Test | | | No damage and normal in operation | No damage and normal in operation | No damage and normal in operation | No damage and normal in operation |
| Tensionless Flex Test | | | 20000 or more times No change | 20000 or more times No change | 20000 or more times No change | 20000 or more times No change |

TABLE 8

| Evaluation item | | | Example 5 | Example 6 | Example 7 | Example 8 |
|---|---|---|---|---|---|---|
| Layer Constitution | Shock Absorbing Layer | Adhesive Agent Composition | Silicone-based | Silicone-based | Silicone-based | Silicone-based |
| | | Pigment | Contained | Contained | None | None |
| | | Item Dissipation Fine Particle | None | Contained | None | None |
| | Heat Diffusion Layer | | Graphite Sheet | Graphite Sheet | Graphite Sheet | Graphite Sheet |
| | Bonding Layer | | Epoxy-based | Epoxy-based | Epoxy-based | Epoxy-based |
| | Shield Layer | | Electrolytic Copper Foil | Electrolytic Copper Foil | Electrolytic Copper Foil | Rolled Copper Foil |
| Physical Property of Shock Absorbing Layer | | Bonding Force to Glass (N/20 mm) | 14 | 12 | 15 | 16 |
| | | Storage Elastic Modulus (Pa) | $2 \times 10^4$ | $2 \times 10^4$ | $2 \times 10^4$ | $2 \times 10^4$ |
| | | tanδ | 0.5 | 0.5 | 0.6 | 0.6 |
| | | Shock Absorptance (%) | 24 | 24 | 25 | 25 |
| | | Thermal Conductivity (W/m · K) | 0.1 | 4 | 0.1 | 0.1 |
| | | Transmittance (%) | <0.1 | <0.1 | 91 | 91 |
| Flexural Modulus (GPa) | | | 2 | 2 | 2 | 1.2 |
| Drop Shock Test | | | No damage and normal in operation | No damage and normal in operation | No damage and normal in operation | No damage and normal in operation |
| Tensionless Flex Test | | | 20000 or more times No change | 20000 or more times No change | 20000 or more times No change | 30000 or more times No change |

TABLE 9

| Evaluation item | | | Example 9 | Example 10 | Comparative Example 1 | Comparative Example 2 |
|---|---|---|---|---|---|---|
| Layer Constitution | Shock Absorbing Layer | Adhesive Agent Composition | Silicone-based | Silicone-based | Foam | Foam |
| | | Pigment | None | None | — | — |
| | | Heat Dissipation Fine Particle | None | None | — | — |
| | Heat Diffusion Layer | | Graphite Sheet | Graphite Sheet | Graphite Sheet | Graphite Sheet |
| | Bonding Layer | | Epoxy-based | Acrylic-based | Epoxy-based | Epoxy-based |
| | Shield Layer | | Electrically Conductive Woven Cloth | Electrolytic Copper Foil | Electrolytic Copper Foil | Electrolytic Copper Foil |
| Physical Property of Shock Absorbing Layer | | Bonding Force to Glass (N/20 mm) | 16 | 16 | <1 | <1 |
| | | Storage Elastic Modulus (Pa) | $2 \times 10^4$ | $2 \times 10^4$ | $1 \times 10^6$ | $1 \times 10^6$ |
| | | tanδ | 0.6 | 0.6 | 0.4 | 0.4 |
| | | Shock Absorptance (%) | 25 | 25 | 25 | |
| | | Thermal Conductivity (W/m · K) | 0.1 | 0.1 | 0.1 | 0.1 |
| | | Transmittance (%) | 91 | 91 | <0.1 | <0.1 |
| Flexural Modulus (GPa) | | | 1.2 | 1.8 | 15 | 16.5 |
| Drop Shock Test | | | No damage and normal in operation | No damage and normal in operation | No damage and normal in operation | No damage and normal in operation |
| Tensionless Flex Test | | | 50000 or more times No change | 20000 or more times No change | Interlayer Peeling occurred at 800 times | Interlayer Peeling occurred at 600 times |

It is seen from a comparison of Example 1 and each of Examples 3 and 4 that the shock absorptance is better in the silicone-based composition than in the acryl-based composition and than in the urethane-based composition. Moreover, it is seen from a comparison of Example 1 and each of Examples 5 and 6 that the transmittance (%) of light having a wavelength of greater than or equal to 300 nm and less than or equal to 850 nm can be reduced to 0.1% or less. The pigment was included in the shock absorbing layer, which enables the light transmittance to be reduced. Moreover, durability against breakage and/or interlayer peeling in the tensionless flex test is improved more in Example 9 in which electrically conductive woven cloth is used as the shield layer than in Example 1.

REFERENCE SIGNS LIST

2 ADHESIVE AGENT COMPOSITION
3 PIGMENT
10, 11, 12, 13 SHOCK ABSORBING LAYER
20 HEAT DIFFUSION LAYER
30 BONDING LAYER
31 EPOXY RESIN
40 SHIELD LAYER
100 SHOCK ABSORBING LAMINATE
101 SHOCK ABSORBING LAMINATE
300 DISPLAY PANEL
400 DISPLAY DEVICE

The invention claimed is:

1. A shock absorbing laminate, comprising:
a shock absorbing layer having an adhesive property and a stress relieving property;
a heat diffusion layer having a thermal diffusive property; and
a shield layer having electromagnetic interference shielding characteristics,
the shock absorbing layer, the heat diffusion layer, and the shield layer being stacked on one another,
the shock absorbing layer including an adhesive agent composition having an adhesive property and a stress relieving property,
the adhesive agent composition including a silicone-based resin,
the adhesive agent composition having the stress relieving property having a storage elastic modulus representing any value within the range from $10^3$ Pa to $10^5$ Pa inclusive and a tan δ representing any value within the range from $10^{-2}$ to 1 inclusive at any temperature between 25° C. and 100° C. inclusive, and
an adhesive force of the adhesive agent composition being greater than or equal to 1 N/20 mm and smaller than or equal to 25 N/20 mm.

2. The shock absorbing laminate of claim 1, wherein
the shock absorbing layer further include a pigment to have a light shielding property.

3. The shock absorbing laminate of claim 1, wherein
the heat diffusion layer is in contact with and is bonded to a surface of the shock absorbing layer.

4. The shock absorbing laminate of claim 1, wherein
the shield layer is bonded via a bonding layer to the heat diffusion layer, and
the bonding layer has thermal conductivity and flexibility.

5. The shock absorbing laminate of claim 4, wherein
the bonding layer includes an epoxy resin having flexibility.

6. The shock absorbing laminate of claim 1, wherein
the shield layer includes electrically conductive woven cloth.

7. A display device, comprising:
the shock absorbing laminate of claim 1; and
a display panel,
the display panel having a non-display-side surface with which the shock absorbing layer is in contact.

8. The shock absorbing laminate of claim 2, wherein
the heat diffusion layer is in contact with and is bonded to a surface of the shock absorbing layer.

9. The shock absorbing laminate of claim 2, wherein
the shield layer is bonded via a bonding layer to the heat diffusion layer, and
the bonding layer has thermal conductivity and flexibility.

10. The shock absorbing laminate of claim 9, wherein
the bonding layer includes an epoxy resin having flexibility.

11. The shock absorbing laminate of claim 2, wherein
the shield layer includes electrically conductive woven cloth.

12. A display device, comprising:
the shock absorbing laminate of claim 2; and
a display panel,
the display panel having a non-display-side surface with which the shock absorbing layer is in contact.

13. The shock absorbing laminate of claim 1, wherein
the shock absorbing layer has a thickness of greater than or equal to 40 μm and less than or equal to 500 μm.

14. The shock absorbing laminate of claim 1, wherein
the shock absorbing layer includes heat dissipation fine particles and liquid enclosing capsules.

* * * * *